(12) United States Patent
Park et al.

(10) Patent No.: US 11,063,100 B2
(45) Date of Patent: Jul. 13, 2021

(54) DISPLAY DEVICE TO PREVENT A CATHODE ELECTRODE FROM BEING SHORTED

(71) Applicant: LG Display Co., Ltd., Seoul (KR)

(72) Inventors: Jongchan Park, Paju-si (KR); JinHwan Kim, Paju-si (KR); Do-Young Kim, Paju-si (KR); Hyunchul Um, Paju-si (KR); YeongHo Yun, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 43 days.

(21) Appl. No.: 16/015,437

(22) Filed: Jun. 22, 2018

(65) Prior Publication Data

US 2019/0013374 A1 Jan. 10, 2019

(30) Foreign Application Priority Data

Jul. 5, 2017 (KR) .................. 10-2017-0085234

(51) Int. Cl.
*H01L 29/08* (2006.01)
*H01L 27/32* (2006.01)
(Continued)

(52) U.S. Cl.
CPC ...... *H01L 27/3258* (2013.01); *H01L 27/3248* (2013.01); *H01L 27/3262* (2013.01);
(Continued)

(58) Field of Classification Search
CPC ............. H01L 27/3258; H01L 27/3248; H01L 27/3262
(Continued)

(56) References Cited

U.S. PATENT DOCUMENTS 9,484,547 B2 * 11/2016 Pyon .................. G09G 3/3258
9,638,949 B1 * 5/2017 Kim ..................... G06F 3/0416
(Continued)

FOREIGN PATENT DOCUMENTS

| KR | 10-2007-0005850 A | 1/2007 |
| KR | 10-2014-0080229 A | 6/2014 |
| KR | 10-2016-0100135 A | 8/2016 |

OTHER PUBLICATIONS

Office Action dated May 7, 2021, issued in corresponding Korean Patent Application No. 10-2017-0085234.

*Primary Examiner* — Caleb E Henry
(74) *Attorney, Agent, or Firm* — Morgan, Lewis & Bockius LLP

(57) ABSTRACT

A display device is disclosed, which may prevent an inorganic film formed in an organic film open area from being damaged and prevent a cathode electrode from being shorted. The display device includes a substrate including a display area on which pixels area arranged, and a non-display area surrounding the display area; a first metal layer formed in the non-display area of the substrate; at least one insulating film arranged on the first metal layer; a second metal layer arranged on the at least one insulating film and connected with the first metal layer through a contact hole that passes through the at least one insulating film formed in the non-display area; a cover layer arranged on the contact hole and formed to overlap the contact hole; and an encapsulation film formed to cover the display area and the cover layer.

20 Claims, 15 Drawing Sheets

(51) Int. Cl.
   *H01L 51/52* (2006.01)
   *G09G 3/3266* (2016.01)
   *G09G 3/3275* (2016.01)

(52) U.S. Cl.
   CPC ...... *H01L 27/3265* (2013.01); *H01L 27/3276* (2013.01); *H01L 51/5212* (2013.01); *H01L 51/5246* (2013.01); *H01L 51/5253* (2013.01); *G09G 3/3266* (2013.01); *G09G 3/3275* (2013.01); *G09G 2310/027* (2013.01); *G09G 2310/0289* (2013.01); *G09G 2310/08* (2013.01); *H01L 2251/5392* (2013.01)

(58) Field of Classification Search
   USPC .......................................................... 257/40
   See application file for complete search history.

(56) References Cited

U.S. PATENT DOCUMENTS

| | | | |
|---|---|---|---|
| 9,786,729 B2 | 10/2017 | You | |
| 2005/0242719 A1* | 11/2005 | Park | H01L 51/5246 313/504 |
| 2006/0081845 A1* | 4/2006 | Bae | H01L 51/5237 257/59 |
| 2010/0149473 A1* | 6/2010 | Guo | G02F 1/1345 349/122 |
| 2011/0221989 A1* | 9/2011 | Lee | G02F 1/134309 349/41 |
| 2013/0069853 A1* | 3/2013 | Choi | H01L 27/3276 345/80 |
| 2013/0105790 A1* | 5/2013 | Tang | H01L 27/1259 257/43 |
| 2013/0120329 A1* | 5/2013 | Wang | G02F 1/13452 345/206 |
| 2014/0346448 A1* | 11/2014 | You | H01L 51/5225 257/40 |
| 2015/0131018 A1* | 5/2015 | Jeon | G02F 1/136286 349/42 |
| 2015/0206933 A1* | 7/2015 | Koshihara | H01L 27/3262 257/40 |
| 2015/0263308 A1* | 9/2015 | Park | H01L 51/5212 257/40 |
| 2016/0148989 A1* | 5/2016 | Jin | H01L 27/3262 257/40 |
| 2016/0233285 A1* | 8/2016 | Lee | H01L 51/5228 |
| 2016/0240598 A1* | 8/2016 | You | H01L 27/3276 |
| 2016/0335973 A1* | 11/2016 | Chung | G09G 3/3648 |
| 2017/0186824 A1* | 6/2017 | Lee | H01L 27/3272 |

\* cited by examiner

DISPLAY DEVICE TO PREVENT A CATHODE ELECTRODE FROM BEING SHORTED

CROSS REFERENCE TO RELATED APPLICATIONS

This application claims the benefit of the Korean Patent Application No. 10-2017-0085234 filed on Jul. 5, 2017, which is hereby incorporated by reference for all purposes as if fully set forth herein.

BACKGROUND

Field of the Disclosure

The present disclosure relates to a display device.

Discussion of the Related Art

With the advancement of the information age, a demand for a display device for displaying an image has been increased in various forms. Therefore, various display devices such as liquid crystal display (LCD) devices, non-self-light emitting display devices such as plasma display panel (PDP) devices, organic light emitting display (OLED) devices and electroluminescence display devices such as quantum dot light emitting display (QLED) devices have been used.

Among the display devices, the organic light emitting display device and the quantum dot light emitting display device are self-light emitting devices, and have advantages in that a viewing angle and a contrast ratio are more excellent than those of the liquid crystal display (LCD) device. Also, since the organic light emitting display device and the quantum dot light emitting display device do not require a separate backlight, it is advantageous that the light emitting display devices are able to be thin and lightweight and have low power consumption. Furthermore, the organic light emitting display device has advantages in that it may be driven at a low direct current voltage, has a fast response speed, and especially has a low manufacturing cost.

The organic light emitting display device includes pixels, each of which includes an organic light emitting diode, and a bank partitioning the pixels to define the pixels. The bank may serve as a pixel definition film. The organic light emitting diode includes an anode electrode, a hole transporting layer, an organic light emitting layer, an electron transporting layer, and a cathode electrode. In this case, if a high potential voltage is applied to the anode electrode and a low potential voltage is applied to the cathode electrode, holes and electrons are moved to the organic light emitting layer through the hole transporting layer and the electron transporting layer, respectively, and are combined with each other in the organic light emitting layer to emit light.

The quantum dot light emitting display device includes a light emitting structure. The light emitting structure includes an anode electrode, a cathode electrode facing the anode electrode, and a light emitting diode arranged between the anode electrode and the cathode electrode. The light emitting diode includes a hole transporting layer, a light emitting layer, and an electron transporting layer. The light emitting layer includes a quantum dot material.

The light emitting diode has a problem in that the light emitting diode is likely to be degraded due to external factors such as external water and oxygen. To prevent such a problem from occurring, the organic light emitting device and the quantum dot light emitting display device include an encapsulation film formed to prevent external water and oxygen from being permeated into the light emitting diode.

FIG. 1 is a cross-sectional view briefly illustrating a display device of the related art.

Referring to FIG. 1, in the display device of the related art, an encapsulation layer 3 is formed on a substrate 1 provided with an organic light emitting diode 2. At this time, the encapsulation layer 3 includes a first inorganic film 3a, an organic film 3b, and a second inorganic film 3c to prevent oxygen and water from being permeated into an organic light emitting layer and an electrode.

The organic film 3b generally includes a polymer, and is formed by a hardening process after being doped on the first substrate 1 in a liquid type. Since the organic film 3b has flexibility until the hardening process is performed, a problem may occur in that the organic film 3b may overflow outside an area where the encapsulation film 3 is to be formed.

To solve this problem, a dam 4 for blocking a flow of the organic film 3b is formed along the outside of the organic light emitting diode 2.

However, since the dam 4 is made of an organic material, water oroxygen may be permeated into the dam 4. To prevent water and oxygenpermeated into the dam 4 from entering the organic light emitting diode 2, the dam 4 and the organic light emitting diode 2 are spaced apart from each other in the display device of the related art. Therefore, in the display device of the related art, an organic film open area O is formed between the dam 4 and the organic film of the organic light emitting diode 2.

The organic film open area O may be provided with a plurality of metal patterns for connecting the organic light emitting diode 2 with a pad, wherein the metal patterns formed on their respective layers different from each other may be connected to each other through a contact hole. Since an organic film is not formed in the organic film open area O, the metal patterns are covered by an inorganic film.

Since the inorganic film formed on the metal patterns is thinly formed, the inorganic film may be damaged during the manufacturing process. Particularly, the inorganic film is formed more thinly in an area where a step difference is generated by the contact hole, whereby a crack may occur. The crack may be propagated into the inside along the inorganic film by external impart, and water or oxygen entering the inside along the propagated crack may cause a dark spot and a dark line spot.

Also, the cathode electrode may be formed in the organic film open area O by a process deviation. At this time, if the cathode electrode is formed on the inorganic film in which a crack occurs, a defect may occur in that the metal patterns and the cathode electrode may be shorted or interfere with each other.

SUMMARY

Accordingly, embodiments of the present disclosure are directed to a display device that substantially obviates one or more problems due to limitations and disadvantages of the related art.

An aspect of the present disclosure is to provide a display device that may prevent an inorganic film formed in an organic film open area from being damaged.

Another aspect of the present disclosure is to provide a display device that may prevent a cathode electrode from being shorted in an organic film open area.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these features and other aspects of the inventive concepts, as embodied and broadly described herein, a display device comprises a substrate including a display area on which pixels area arranged, and a non-display area surrounding the display area; a first metal layer formed in the non-display area of the substrate; at least one insulating film arranged on the first metal layer; a second metal layer arranged on the at least one insulating film and connected with the first metal layer through a contact hole that passes through the at least one insulating film formed in the non-display area; a cover layer arranged on the contact hole; and an encapsulation film formed to cover the display area and the cover layer, wherein the cover layer is formed to overlap the contact hole.

In another aspect, a display comprises a substrate including a display area on which pixels area arranged, and a non-display area surrounding the display area; a first gate line connected with N pixels of the pixels; a second gate line connected with M pixels smaller than the N pixels; and a compensation transistor or a compensation capacitor arranged in the non-display area and connected with the second gate line, wherein the compensation transistor or the compensation capacitor includes: a first metal layer formed on the substrate; a first insulating film arranged on the first metal layer; a third metal layer arranged on the first insulating film and connected with the second gate line; a second insulating film arranged on the third metal layer; a second metal layer arranged on the second insulating film and connected with the first metal layer through a contact hole that passes through at least one of the first and second insulating films; and a cover layer arranged on the contact hole.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
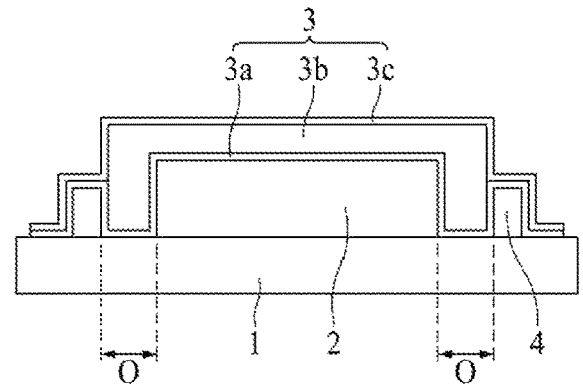
FIG. 1 is a cross-sectional view briefly illustrating a display device of the related art.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another element. For example, a first element could be termed a second element, and, similarly, a second element could be termed a first element, without departing from the scope of the present disclosure.

"X-axis direction", "Y-axis direction" and "Z-axis direction" should not be construed by a geometric relation only of a mutual vertical relation, and may have broader directionality within the range that elements of the present disclosure may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the preferred embodiments of the present disclosure will be described in detail with reference to the accompanying drawings.

Figure 2:
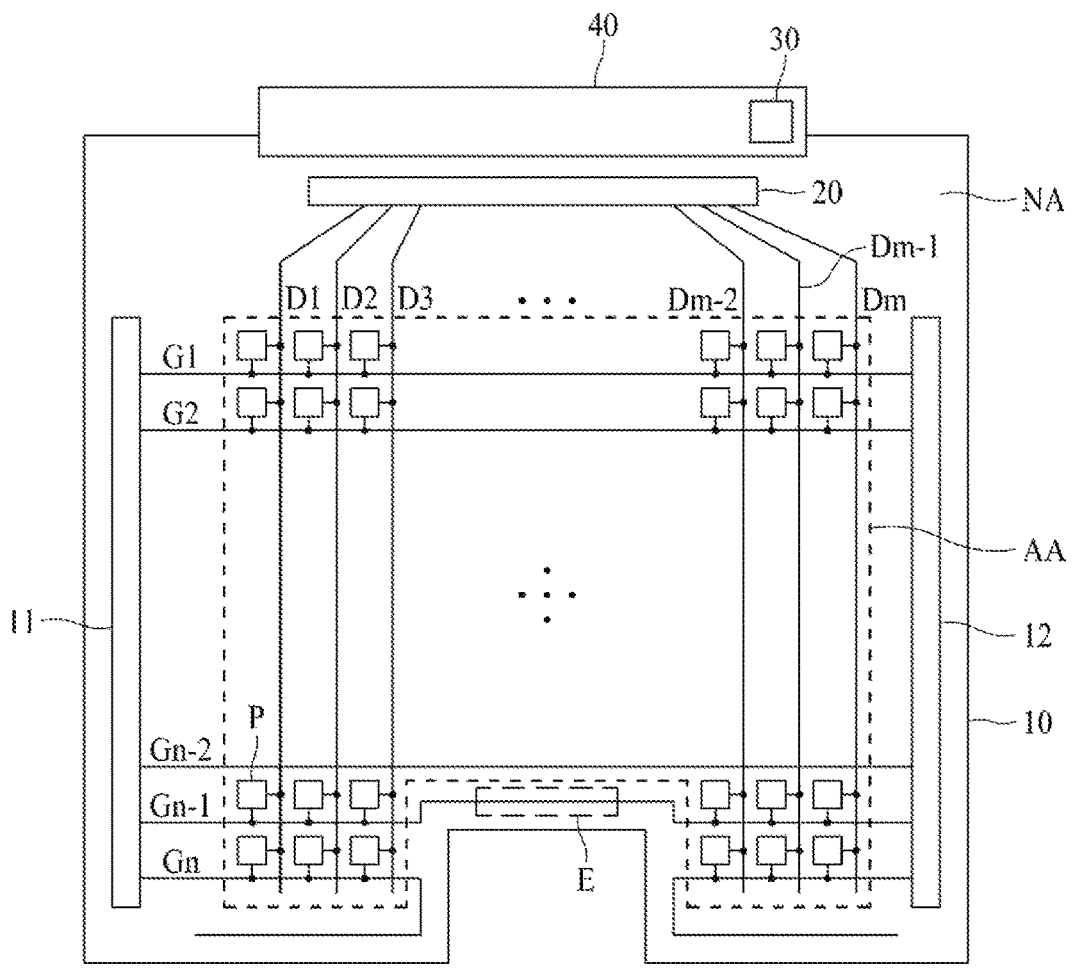
FIG. 2 is a view briefly illustrating a display device according to one embodiment of the present disclosure.

FIG. 2 is a view briefly illustrating a display device according to one embodiment of the present disclosure.

The display device according to the embodiment of the present disclosure include all display devices for supplying data voltages to pixels in a line scanning mode for supplying gate signals to gate lines G1 to Gn. For example, the display device according to the embodiment of the present disclosure may be realized as any one of a liquid crystal display, an organic light emitting display, an electroluminescence display, a quantum dot light emitting display device, and an electrophoresis display device. Hereinafter, the display device according to the embodiment of the present disclosure is realized as, but not limited to, an organic light emitting display device.

The display device according to one embodiment of the present disclosure includes a display panel 10, a first gate driver 11, a second gate driver 12, an integrated driver 20, a power supply 30, and a flexible circuit board 40. The integrated driver 20 includes a data driver, a level shifter and a timing controller.

Figure 3:
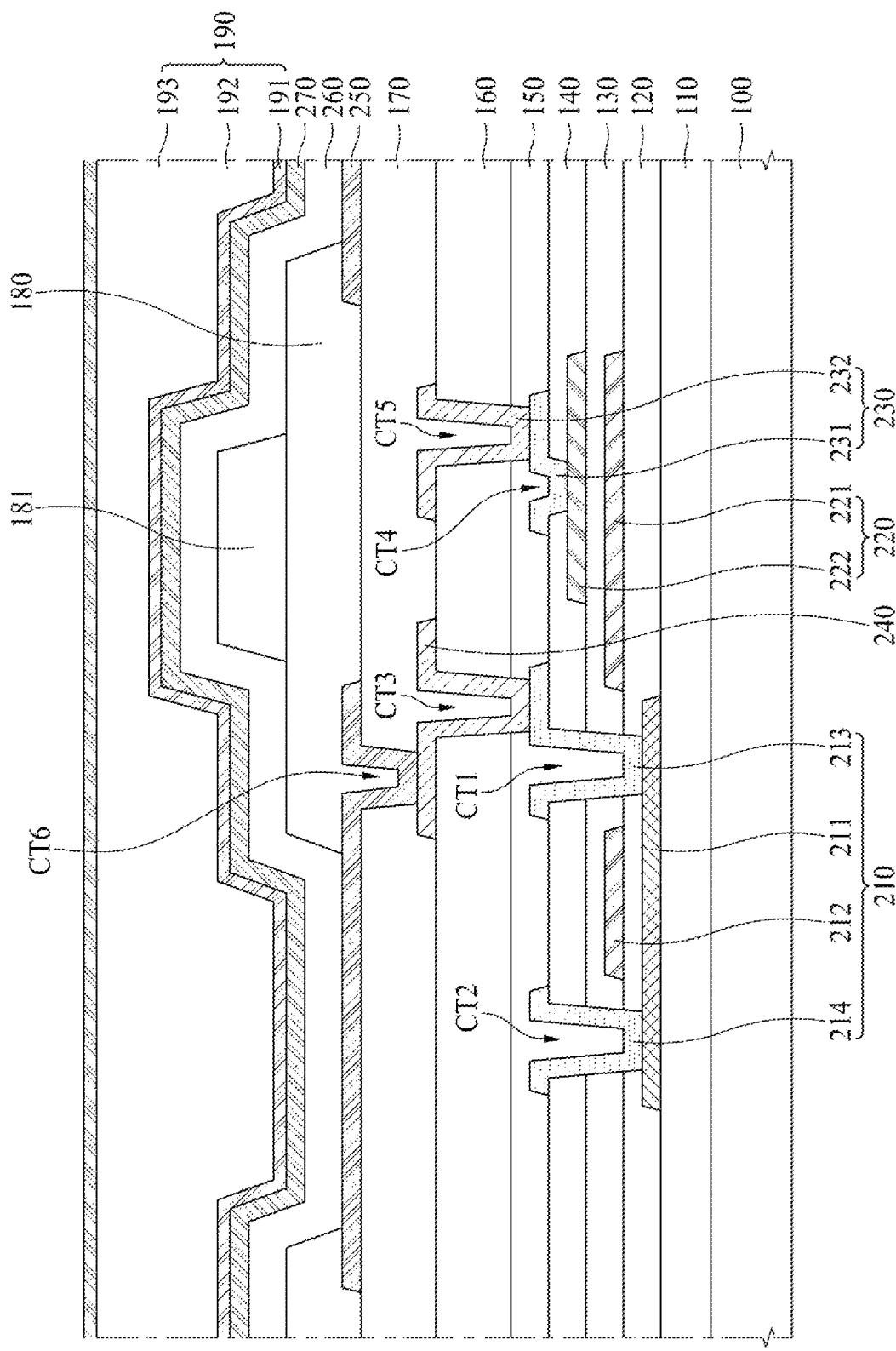
FIG. 3 is a cross-sectional view illustrating pixels of FIG. 2.

The display panel 10 may be categorized into a display area AA provided with pixels P to display an image and a non-display area NA for not displaying an image. On the display area AA, data lines D1 to Dm (m is a positive integer of 2 or more), gate lines G1 to Gn (n is a positive integer of 2 or more), and pixels P. The data lines D1 to Dm are formed to cross the gate lines G1 to Gn. The pixels P may be connected to any one of the data lines D1 to Dm and any one of the gate lines G1 to Gn. The pixels P may be realized as an organic light emitting diode that includes an anode electrode, a light emitting layer, and a cathode electrode as shown in FIG. 3, thereby emitting light. On the non-display area NA, the first gate driver 11, the second gate drivers 12 and the integrated driver 20 are formed.

On the display panel 10, the number of pixels P connected to each of the data lines D1 to Dm (m is a positive integer of 2 or more) may be the same. And, the number of pixels P connected to each of the gate lines G1 to Gn (n is a positive integer of 2 or more) may be the same. However, the display panel 10 is not limited to this case. On the display panel 10, the number of pixels P connected to each of the data lines D1 to Dm (m is a positive integer of 2 or more) may be different. Also, the number of pixels P connected to each of the gate lines G1 to Gn (n is a positive integer of 2 or more) may be different. In more detail, M pixels P are connected to the first gate line G1 arranged on an upper end of the display panel 10, whereas K pixels P smaller than M may be connected to the Nth gate line Gn arranged on a lower end of the display panel 10. At this time, since the number of pixels P connected to the Nth gate line Gn is smaller than the number of pixels P connected to the first gate line G1, load of the Nth gate line Gn is small. In this way, load deviation occurs in the first and Nth gate lines to which different number of pixels P are connected. This load deviation may occur even in the data lines D1 to Dm and high potential voltage lines (not shown) as well as the gate lines. Load deviation between signal lines may cause unbalance in luminance, whereby display quality of the display device may be deteriorated. To solve this problem, the display panel 10 may compensate for load deviation by forming a compensation transistor or a compensation capacitor in the non-display area NA. A detailed description of the compensation transistor and the compensation capacitor will be described later.

The first and second gate drivers 11 and 12 are connected to the gate lines G1 to Gn and supply gate signals. In more detail, the first and second gate drivers 11 and 12 receive clock signals and gate control signals including a start voltage from the level shifter. The first and second gate drivers 11 and 12 generate gate signals in accordance with the start voltage and clock signals and output the generated signals to the gate lines G1 to Gn.

The first and second gate drivers 11 and 12 may be formed in the non-display area NA in a gate driver in panel (GIP) mode. For example, as shown in FIG. 2, the first gate driver 11 may be formed on the non-display area NA outside one side of the display area AA, and the second gate driver 12 may be formed on the non-display area NA outside the other side of the display area AA. Meanwhile, any one of the first and second gate drivers 11 and 12 may be omitted. In this case, one gate driver may be formed on the non-display area NA outside at one side of the display area AA.

The data driver is connected to the data lines D1 to Dm. The data driver receives digital video data and a data control signal from the timing controller. The data driver converts the digital video data to analog data voltages in accordance with the data control signal. The data driver supplies the analog data voltages to the data lines D1 to Dm.

The timing controller receives the digital video data and timing signals from an external system board. The timing signals may include a vertical synchronization signal, a horizontal synchronization signal, and a data enable signal.

The timing controller generates a gate control signal for controlling operation timing of the first and second gate drivers 11 and 12 and a data control signal for controlling operation timing of the data driver on the basis of the timing signals.

The data driver, the level shifter, and the timing controller may be formed as one integrated circuit (IC) like the integrated driver 20 of FIG. 2. However, the embodiment of the present disclosure is not limited to this case, and each of the data driver, the level shifter, and the timing controller may be formed as a separate driving IC. The integrated driver 20 may directly be attached onto the lower substrate of the display panel 10 in a chip on glass (COG) mode or a chip on plastic (COP) mode.

The power supply 30 generates a plurality of power voltages required to drive the pixels, such as VDD voltage and VSS voltage, gate driving voltages required to drive the first and second gate drivers 11 and 12, such as a gate on voltage Von and a gate off voltage Voff, a source driving voltage required to drive the data driver, and a control driving voltage required to drive the timing controller. The power supply 30 may be packaged in the flexible circuit board 40 as shown in FIG. 2. The flexible circuit board 40 may be a flexible printed circuit board.

FIG. 3 is a cross-sectional view illustrating pixels of FIG. 2.

In FIG. 3, the pixels P include an organic light emitting diode having an anode electrode 250, a light emitting layer 260 and a cathode electrode 270.

Referring to FIG. 3, a buffer film 110 is formed on one surface of the lower substrate 100. The lower substrate 100 may be, but not limited to, a plastic film or glass substrate. The buffer film 110 may be formed on one surface of the lower substrate 100 to protect thin film transistors 210 and light emitting diodes from water permeated through the lower substrate 100 which is vulnerable to moisture permeability. The buffer film 110 may be made of a plurality of inorganic films which are deposited alternately. For example, the buffer film 110 may be formed of a multi-layered film of one or more inorganic films of a silicon oxide film (SiOx), a silicon nitride film (SiNx) and SiON, which are deposited alternately. The buffer film 110 may be omitted.

The thin film transistor 210, a capacitor 220 and a high potential voltage line 230 are formed on the buffer film.

The thin film transistor 210 includes an active layer 211, a gate electrode 212, a source electrode 213, and a drain electrode 214. Although the thin film transistor 210 is formed in a top gate mode in which the gate electrode 212 is arranged above the active layer 211 as shown in FIG. 3, it is to be understood that the thin film transistor of the present disclosure is not limited to the top gate mode. That is, the thin film transistor 210 may be formed in a bottom gate mode in which the gate electrode 212 is arranged below the active layer 211 or a double gate mode in which the gate electrode 212 is arranged above and below the active layer 211.

The capacitor 220 includes a first capacitor electrode 221 and a second capacitor 222. The high potential voltage line 230 includes first and second high potential voltage lines 231 and 232.

In detail, the active layer 211 is formed on the buffer film 110. The active layer 211 may be formed of a silicon based semiconductor material or an oxide based semiconductor material. A light-shielding layer and insulating film for shielding external light entering the active layer 211 may be formed between the buffer film 110 and the active layer 211.

A gate insulating film 120 may be formed on the active layer 211. The gate insulating film 220 may be formed of an inorganic film, for example, a silicon oxide film (SiOx), a silicon nitride film (SiNx) or a multi-layered film of the silicon oxide film and the silicon nitride film.

The gate electrode 212, the first capacitor electrode 221 and the gate line may be formed on the gate insulating film 120. The first capacitor electrode 221 may be extended from the gate electrode 212. The gate electrode 212, the first capacitor electrode 221 and the gate line may be formed of a single layer or multi-layer comprised of any one of Mo, Al, Cr, Au, Ti, Ni, Nd and Cu or their alloy.

A first inter-layer dielectric film 130 may be formed on the gate electrode 212, the first capacitor electrode 221 and the gate line. The first inter-layer dielectric film 130 may be formed of an inorganic film, for example, a silicon oxide film (SiOx), a silicon nitride film (SiNx), or a multi-layered film of the silicon oxide film and the silicon nitride film.

The second capacitor electrode 222 may be formed on the first inter-layer dielectric film 130. The second capacitor electrode 222 may be formed of a single layer or multi-layer comprised of any one of Mo, Al, Cr, Au, Ti, Ni, Nd and Cu or their alloy.

A second inter-layer dielectric film 140 may be formed on the second capacitor electrode 222. The second inter-layer dielectric film 140 may be formed of an inorganic film, for example, a silicon oxide film (SiOx), a silicon nitride film (SiNx), or a multi-layered film of the silicon oxide film and the silicon nitride film.

The source electrode 213, the drain electrode 214, the first high potential voltage line 231 and the date line may be formed on the second inter-layer dielectric film 140. The source electrode 213 may be connected to the active layer 211 through a first contact hole CT1 that passes through the gate insulating film 120 and the first and second inter-layer dielectric films 130 and 140. The drain electrode 214 may be connected to the active layer 211 through a second contact hole CT2 that passes through the gate insulating film 120 and the first and second inter-layer dielectric films 130 and 140. The first high potential voltage line 231 may be connected to the second capacitor electrode 222 through a fourth contact hole CT4 that passes through the second inter-layer insulating film 140. Each of the source electrode 213, the drain electrode 214, the first high potential voltage line 231 and the data line may be formed of a single layer or multi-layer comprised of any one of Mo, Al, Cr, Au, Ti, Ni, Nd and Cu or their alloy.

A passivation film 150 for insulating the thin film transistor 210 may be formed on the source electrode 213, the drain electrode 214, the first high potential voltage line 231 and the data line. The passivation film 150 may be formed of an inorganic film, for example, a silicon oxide film (SiOx), a silicon nitride film (SiNx), or a multi-layered film of the silicon oxide film and the silicon nitride film.

A first planarization film 160 for planarizing a step difference due to the thin film transistor 210 may be formed on the passivation layer 150. The first planarization film 160 may be formed of an organic film such as acrylic resin, epoxy resin, phenolic resin, polyamide resin, and polyimide resin.

An anode auxiliary electrode 240 and the second high potential voltage line 232 may be formed on the first planarization film 160. The anode auxiliary electrode 240 may be connected to the source electrode 213 through a third contact hole CT3 that passes through the passivation film 150 and the first planarization film 160. The second high potential voltage line 232 may be connected to the first high potential voltage line 231 through a fifth contact hole CT5 that passes through the passivation film 150 and the first planarization film 160. Each of the anode auxiliary electrode 240 and the second high potential voltage line 232 may be formed of a single layer or multi-layer comprised of any one of Mo, Al, Cr, Au, Ti, Ni, Nd and Cu or their alloy. The anode auxiliary electrode 240 and the second high potential voltage line 232 may be omitted.

A second planarization film 170 may be formed on the anode auxiliary electrode 240 and the second high potential voltage line 232. The second planarization film 170 may be formed of an organic film such as acrylic resin, epoxy resin, phenolic resin, polyamide resin, and polyimide resin. If the anode auxiliary electrode 240 and the second high potential voltage line 232 are omitted, the second planarization film 170 may be omitted.

A light emitting diode, a bank 180, and a spacer 180 are formed on the second planarization film 170. The light emitting diode includes an anode electrode 250, a light emitting layer 260, and a cathode electrode 270.

The anode electrode 250 may be formed on the second planarization film 170. The anode electrode 250 may be connected to the anode auxiliary electrode 240 through a sixth contact hole CT6 that passes through the second planarization film 170. The anode electrode 250 may be formed of a deposition structure (Ti/Al/Ti) of Al and Ti, a deposition structure (ITO/Al/ITO) of Al and ITO, an APC alloy, or a deposition structure (ITO/APC/ITO) of APC alloy and ITO. The APC alloy is an alloy of Ag, Pd and Cu.

The bank 180 may be formed to cover an edge of the anode electrode 250, whereby a light emitting area of the pixels P may be defined by the bank 180. The light emitting area of the pixels P indicates an area where the anode electrode 250, the light emitting layer 260 and the cathode electrode 270 are sequentially deposited and thus holes from the anode electrode 250 are combined with electrons from the cathode electrode 270 in the light emitting layer 260 to emit light. In this case, since the area where the bank 180 is formed does not emit light, this area may be defined as a non-emission area. The bank 180 may be formed of an organic film such as acrylic resin, epoxy resin, phenolic resin, polyamide resin, and polyimide resin. The spacer 181 may be formed on the bank 180. The spacer 181 may be formed of an organic film such as acrylic resin, epoxy resin, phenolic resin, polyamide resin, and polyimide resin. The spacer 181 may be omitted.

The light emitting layer 260 may be formed on the anode electrode 250, the bank 180 and the spacer 181. The light emitting layer 260 is a common layer commonly formed on the pixels P, and may be a white light emitting layer for emitting white light. In this case, the light emitting layer 260 may be formed in a tandem structure of two stacks or more. Each of the stacks may include a hole transporting layer, at least one light emitting layer, and an electron transporting layer. Also, a charge generating layer may be formed between the stacks.

The hole transporting layer serves to actively deliver holes injected from the anode electrode 250 or the charge generating layer to the light emitting layer. The light emitting layer may be formed of an organic material that includes phosphor or fluorescent material, whereby predetermined light may be emitted. The electron transporting layer serves to actively deliver electrons injected from the cathode electrode 270 or the charge generating layer to the light emitting layer.

The charge generating layer may include an n type charge generating layer arranged to adjoin the lower stack, and a p type charge generating layer formed on the n type charge generating layer and arranged to adjoin the upper stack. The n type charge generating layer injects electrons into the lower stack, and the p type charge generating layer injects holes into the upper stack. The n type charge generating layer may be an organic layer doped with alkali metal such as Li, Na, K or Cs, or alkali earth metal such as Mg, Sr, Ba or Ra. The p type charge generating layer may be an organic layer of an organic host material doped with a dopant, wherein the organic host material has hole transportation capability.

Although the light emitting layer 260 is a common layer commonly formed in the pixels P and is a white light emitting layer for emitting white light in FIG. 3, the embodiment of the present disclosure is not limited to the example of FIG. 3. That is, the light emitting layer 260 may be formed in each of the pixels P. In this case, the pixels P may include a red pixel including a red light emitting layer for emitting red light, a green pixel including a green light emitting layer for emitting green light, and a blue pixel including a blue light emitting layer for emitting blue light.

The cathode electrode 270 is formed on the light emitting layer 260. The cathode electrode 270 is a common layer commonly formed in the pixels P. The cathode electrode 270 may be formed of a transparent conductive material (TCO) such as ITO and IZO, which may transmit light, or a semi-transmissive conductive material such as Mg, Ag, and alloy of Mg and Ag. If the cathode electrode 270 is formed of a semi-transmissive conductive material, light-emission efficiency may be enhanced by mirco cavity. A capping layer may be formed on the cathode electrode 270.

An encapsulation film 190 is formed on the cathode electrode 270. The encapsulation film 190 serves to prevent oxygen or water from being permeated into the light emitting layer 260 and the cathode electrode 270. The encapsulation film 190 may include at least one inorganic film and at least one organic film.

For example, the encapsulation film 190 may include a first inorganic film 191, an organic film 192, and a second inorganic film 193. In this case, the first inorganic film 191 is formed to cover the cathode electrode 270. The organic film 192 is formed on the first inorganic film 191. Preferably, the first organic film 192 is formed with a sufficient thickness to prevent particles from being permeated into the light emitting layer 260 and the cathode electrode 270 by passing through the first inorganic film 191. The second inorganic film 192 is formed to cover the organic film 192.

Each of the first and second inorganic films 191 and 193 may be formed of a silicon nitride, an aluminum nitride, a zirconium nitride, a titanium nitride, a hafnium nitride, a tantalum nitride, silicon oxide, an aluminum oxide, or a titanium oxide.

The organic film 192 may be formed transparently to transmit light emitted from the light emitting layer 260. The organic film 192 may be formed of an organic material, which may transmit light emitted from the light emitting layer 192 at 99% or more, for example, acrylic resin, epoxy resin, phenolic resin, polyamide resin, or polyimide resin.

Color filters and a black matrix may be formed on the upper substrate, and the upper substrate and the lower substrate may be bonded to each other by an adhesive layer. In this case, the color filters may be arranged to correspond to an emission area of the pixel P, and the black matrix may be arranged between the color filters to correspond to the bank 180. The adhesive layer may be a transparent adhesive film or a transparent adhesive resin. The upper substrate may be a plastic film, a glass substrate, or an encapsulation film (passivation film).

Referring to FIG. 2 again, a plurality of metal patterns are formed in the non-display area NA of the display panel 10. The metal patterns formed on their respective layers different from each other may be connected to each other through a contact hole. The present disclosure is characterized in that a cover layer is formed on the contact hole to cover a step difference generated by the contact hole. Hereinafter, the non-display area NA of the display panel 10 will be described in more detail together with various embodiments.

First Embodiment

Figure 4:
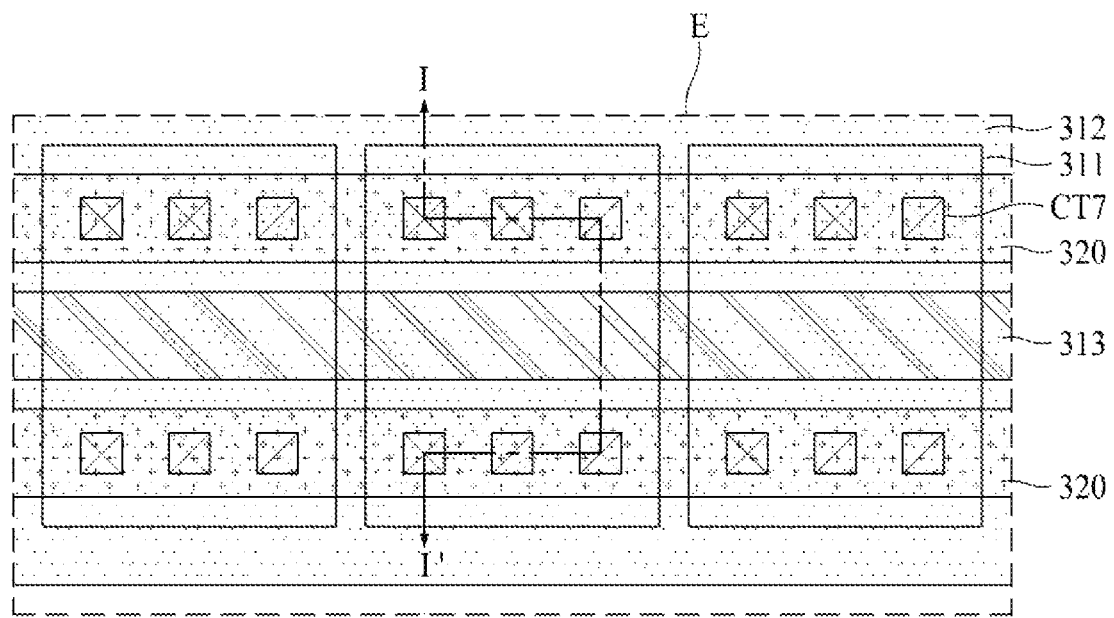
FIG. 4 is a detailed plane view illustrating a first embodiment of a non-display area of FIG. 2.
Figure 5:
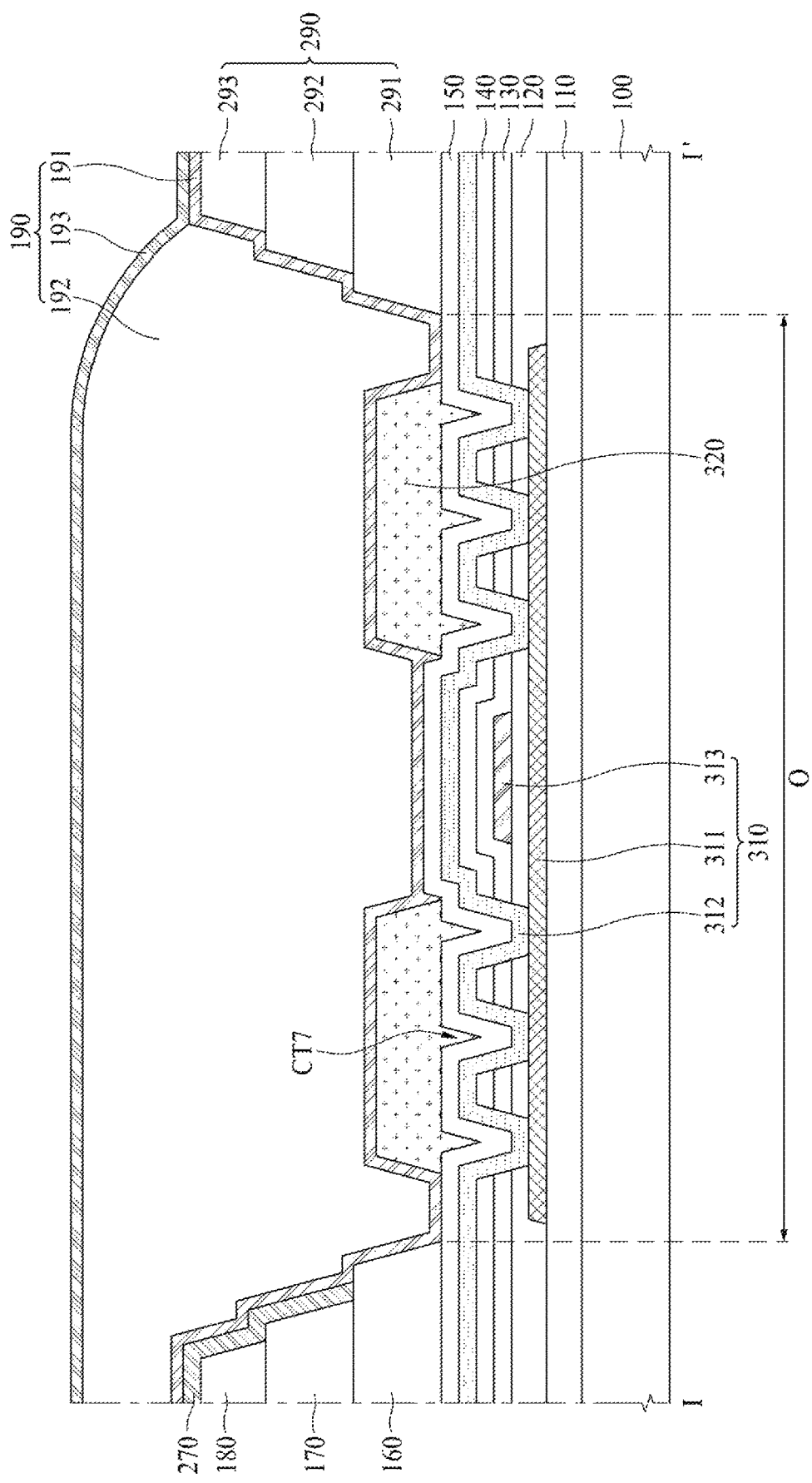
FIG. 5 is a cross-sectional view illustrating an example taken along line I-I' of FIG. 4.
Figure 6:
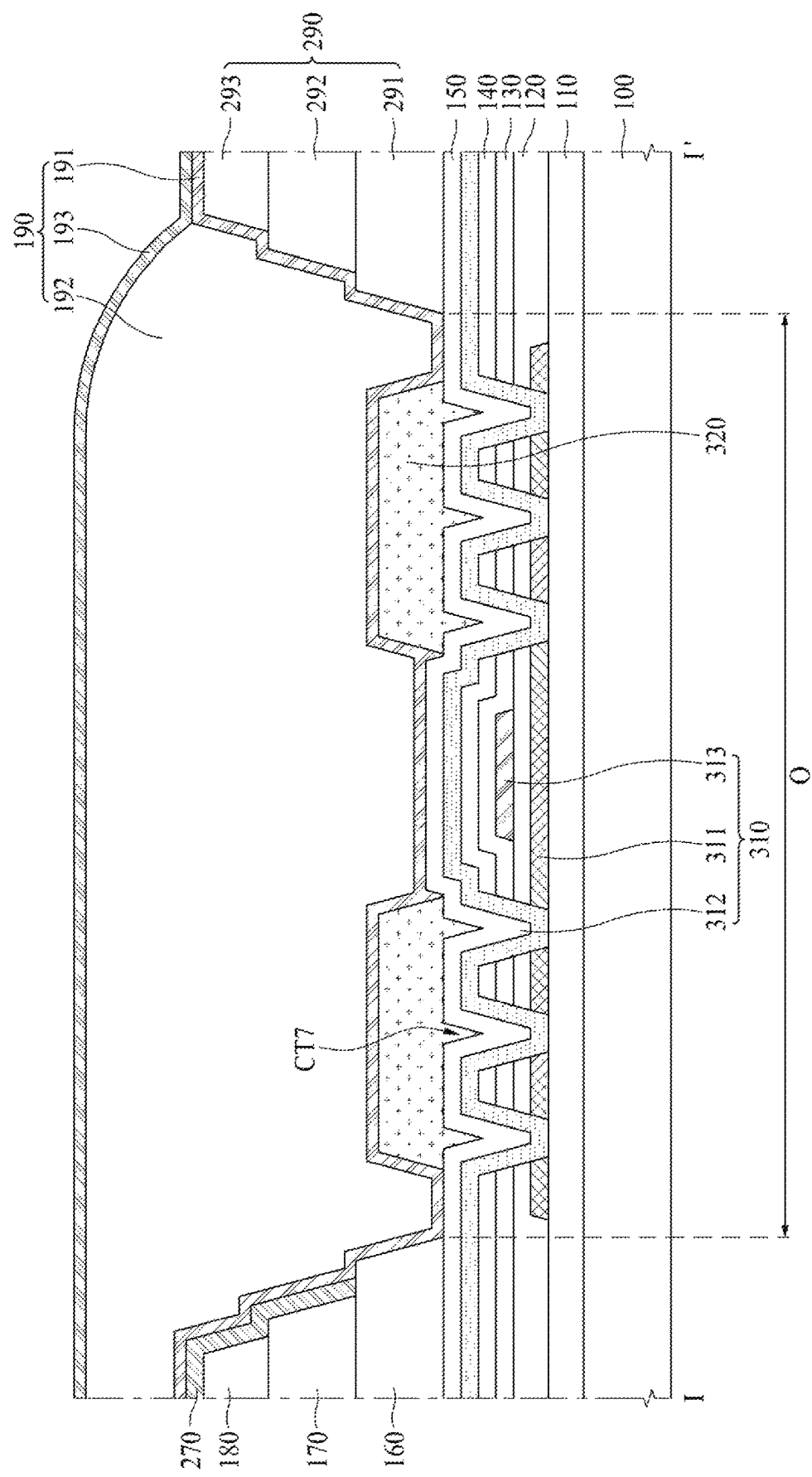
FIG. 6 is a cross-sectional view illustrating another example taken along line I-I' of FIG. 5.

FIG. 4 is a detailed plane view illustrating a first embodiment of a non-display area of FIG. 2, FIG. 5 is a cross-sectional view illustrating an example taken along line I-I' of FIG. 4, and FIG. 6 is a cross-sectional view illustrating another example taken along line I-I' of FIG. 5.

Referring to FIGS. 4 and 5, a compensation transistor 310, a first cover layer 320 and a dam 290 are arranged on the non-display area NA of the display panel 10.

The dam 290 is formed to surround the outside of the display area AA and blocks a flow of the organic film 192 constituting the encapsulation film 190. Since the organic film 192 constituting the encapsulation film 190 has excellent covering performance but has low barrier performance, the organic film 192 should be encapsulated by the second inorganic film 193. However, if the area where the organic film 192 is to be formed overflows, water or oxygen may be permeated into the area through the organic film 192 exposed without being encapsulated by the second inorganic film 193. To avoid this, the flow of the organic film 192 is blocked using the dam 290, whereby the organic film 192 may be prevented from being exposed to the outside of the display device.

Also, the dam 290 may be arranged between the display area AA and a pad and blocks the flow of the organic film 192 to allow the organic film 192 constituting the encapsulation film 190 not to be permeated into the pad. If the organic film 192 constituting the encapsulation film 190 is permeated into the pad, electric contact is not performed normally in the pad due to the organic film 192, whereby a driving defect or a lighting text defect may occur. To solve this problem, the flow of the organic film 192 constituting the encapsulation film 190 is blocked using the dam 290, whereby the organic film 192 may be prevented from being permeated into the pad.

Although one dam 290 is shown in FIG. 5, the present disclosure is not limited to the example of FIG. 5. In other embodiment, the dam 290 may include a first dam and a second dam spaced apart from the first dam and arranged in the non-display area. The second dam blocks the flow of the organic film 192 overflowing to the outside of the first dam.

The dam 290 may be formed simultaneously with at least one of the first planarization film 160, the second planarization film 170, the bank 180 and the spacer 181 of the pixel P, and may be made of the same material as that of at least one of the first planarization film 160, the second planarization film 170, the bank 180 and the spacer 181.

For example, the dam 290 may include a first layer 291 formed of the same material as that of the first planarization film 160 simultaneously with the first planarization film 160, a second layer 292 formed of the same material as that of the second planarization film 170 simultaneously with the second planarization film 170, and a third layer 293 formed of the same material as that of the bank 180 simultaneously with the bank 180.

For another example, the dam 290 may include a first layer 291 formed of the same material as that of the second planarization film 170 simultaneously with the second planarization film 170, a second layer 292 formed of the same material as that of the bank 180 simultaneously with the bank 180, and a third layer 293 formed of the same material as that of the spacer 181 simultaneously with the spacer 181.

In this case, the dam 120 may be formed of an organic film such as acrylic resin, epoxy resin, phenolic resin, polyamide resin, and polyimide resin.

The dam 290 is spaced apart from the organic films, which are formed in the display area AA, for example, the first planarization film 160, the second planarization film 170, the bank 180 and the spacer 181. At this time, at least one of the first planarization film 160, the second planarization film 170, the bank 180 and the spacer 181 may be formed from the display area AA to some of the non-display area NA as shown in FIG. 5. As described above, the dam 290 may be formed of the same organic material as that of the first planarization film 160, the second planarization film 170, the bank 180 and the spacer 181. In this case, water or oxygen permeated into the dam 290 may be absorbed into the first planarization film 160, the second planarization film 170, the bank 180 or the spacer 181 and then permeated into the light emitting diode. Therefore, degradation may occur in the light emitting diode. To avoid this, in the present disclosure, the dam 290 is spaced apart from the organic films formed in the display area AA, for example, the first planarization film 160, the second planarization film 170, the bank 180 and the spacer 181 to form an organic film open area O, whereby a water permeation path is not provided.

The compensation transistor 310 may be arranged in the non-display area NA to allow the light emitting diode not to emit light but generates load, that is, dummy load, which is similar to that of the thin film transistor 210 of the pixel P arranged in the display area AA.

The compensation transistor 310 may be arranged between the organic films formed in the display area AA and the dam 290, and includes a first metal layer 311, a second metal layer 312, and a third metal layer 313.

The first metal layer 311 may be formed on the same layer as the active layer 211 constituting the thin film transistor 210 of the pixel P arranged in the display area AA. The first metal layer 311 may be formed of the same material as that of the active layer 211, and may be formed of a silicon based semiconductor material or an oxide based semiconductor material.

The gate insulating film 120 may be formed on the first metal layer 311. The gate insulating film 120 may be formed of an inorganic film, for example, a silicon oxide film (SiOx), a silicon nitride film (SiNx) or a multi-layered film of the silicon oxide film and the silicon nitride film.

The third metal layer 313 may be formed on the same layer as the gate electrode 212 constituting the thin film transistor 210 of the pixel P arranged in the display area AA. The third metal layer 313 may be connected with the gate electrode 212 of the display area AA. The third metal layer 313 may be formed of the same material as that of the gate electrode 212, and may be formed of a single layer or multi-layer comprised of any one of Mo, Al, Cr, Au, Ti, Ni, Nd and Cu or their alloy.

The first and second inter-layer dielectric films 130 and 140 may be formed on the third metal layer 313. The first and second inter-layer dielectric films 130 and 140 may be formed of an inorganic film, for example, a silicon oxide film (SiOx), a silicon nitride film (SiNx) or a multi-layered film of the silicon oxide film and the silicon nitride film.

The second metal layer 312 may be formed on the same layer as the source electrode 213, the drain electrode 214 and the first high potential voltage line 231, which constitute the thin film transistor 210 of the pixel P arranged in the display area AA. The second metal layer 312 may be connected with the first high potential voltage line 231. The method metal layer 312 may be connected with the first metal layer 311 through at least one seventh contact hole CT7 that passes through the gate insulating film 120 and the first and second inter-layer dielectric films 130 and 140. Although the seventh contact hole CT7 passes through the gate insulating film 120 and the first and second inter-layer dielectric films 130 and 140 in FIG. 5, the present disclosure is not limited to the example of FIG. 5. In other embodiment, the seventh contact hole CT7 may pass through the first metal layer 311 as well as the gate insulating film 120 and the first and second inter-layer dielectric films 130 and 140 as shown in FIG. 6. At this time, the second metal layer 312 may be connected with the first metal layer 311 by side contact.

The second metal layer 312 may be formed of the same material as that of the source electrode 213, the drain electrode 214 and the first high potential voltage line 231, and may be formed of a single layer or multi-layer comprised of any one of Mo, Al, Cr, Au, Ti, Ni, Nd and Cu or their alloy.

The passivation film 150 may be formed on the second metal layer 312. The passivation film 150 may be formed of an inorganic film, for example, a silicon oxide film (SiOx), a silicon nitride film (SiNx) or a multi-layered film of the silicon oxide film and the silicon nitride film.

Although the compensation transistor 310 is arranged in the non-display area NA in FIGS. 4 and 5, the present disclosure is not limited to the examples of FIGS. 4 and 5. In other embodiment, a compensation capacitor may be arranged in the non-display area NA. At this time, the compensation capacitor may include a first metal layer, a second metal layer, and a third metal layer in the same manner as the compensation transistor. The second metal layer and the third metal layer of the compensation capacitor may be the same as the second metal layer 312 and the third metal layer 313 of the compensation transistor 310. However, the first metal layer of the compensation capacitor may be formed of a metal material not a semiconductor material unlike the first metal layer 311 of the compensation transistor 310. For example, the first metal layer of the compensation capacitor may be an active layer metalized by doping, etc. The metalized active layer corresponds to a layer processed by a doping process of an oxide semiconductor such as the active layer 211 constituting the thin film transistor 210 of the pixel P to have metal property not semiconductor property.

The first cover layer 320 is arranged on the compensation transistor 310 in the non-display area NA. The first cover layer 320 serves to cover a step difference generated by the seventh contact hole CT7 of the compensation transistor 310. In the related art, the compensation transistor 310 is protected by only a thin inorganic film, that is, the passivation film 150 during a manufacturing process before the encapsulation film 190 is formed. Since the passivation film 150 is thinly formed, the passivation film 150 may be damaged during the manufacturing process. Particularly, the passivation film 150 may be formed more thinly in the area where the step difference is generated by the seventh contact hole CT7, whereby a crack may occur. The crack may be propagated into the inside along the passivation film 150 by external impart, and water or oxygen entering the inside along the propagated crack may cause a dark spot and a dark line spot.

Also, the passivation film 150 formed on the compensation transistor 310 may be damaged due to excessive etching during formation of the anode auxiliary electrode 240 and the second high potential voltage line 232.

Also, the cathode electrode 270 of the pixel P may be formed in the organic film open area O by process deviation. At this time, if the cathode electrode 270 is formed on the inorganic film where the crack is generated, a defect may occur in that the second metal layer 312 and the cathode electrode 270 may be shorted or interfere with each other.

To solve the aforementioned problems, the first cover layer 320 is arranged to overlap the seventh contact hole CT7 of the compensation transistor 310, whereby a groove generated by the seventh contact hole CT7 is filled with the first cover layer 320. If a plurality of seventh contact holes CT7 are provided, the first cover layer 320 may be formed along the plurality of seventh contact holes CT7 in the form of line as shown in FIG. 4.

The first cover layer 320 may be formed simultaneously with at least one of the first planarization film 160, the second planarization film 170, the bank 180 and the spacer 181, and may be made of the same material as that of at least one of the first planarization film 160, the second planarization film 170, the bank 180 and the spacer 181. In this case, the first cover layer 320 may be formed of an organic material such as acrylic resin, epoxy resin, phenolic resin, polyamide resin, and polyimide resin.

Preferably, the first cover layer 320 is formed of the same material as that of the first planarization film 160 simultaneously with the first planarization film 160 to prevent the passivation film 150 in the organic film open area O from being damaged during the later manufacturing process. However, the present disclosure is not limited to this example. The first cover layer 320 may be formed simultaneously with the second planarization film 170, the bank 180 or the spacer 181. In this case, the first cover layer 320 may block that the cathode electrode 270 is connected with the first metal layer 311 of the compensation transistor 310 even though the passivation film 150 is damaged in the organic film open area O.

The first cover layer 320 may be formed simultaneously with at least one of the first planarization film 160, the second planarization film 170, the bank 180 and the spacer 181, whereby a new step difference may be generated. The first inorganic film 191 constituting the encapsulation film 190 is formed to cover the first cover layer 320 formed in the non-display area NA as well as the pixel P of the display area AA. The step difference generated by the first cover layer 320 may be a factor that fails to uniformly form the thickness of the first inorganic film 191 constituting the encapsulation film 190 during the process of forming the encapsulation film 190. Particularly, the first inorganic film 191 may be formed more thinly in the area where the first cover layer 320 adjoins the passivation film 150, whereby a crack may be generated. The crack may be propagated into the inside along the inorganic film by external impart, and water or oxygen entering the inside along the propagated crack may cause a dark spot and a dark line spot.

To solve the aforementioned problem, the first cover layer 320 may be formed to reduce the step difference or have an inclined side through an exposure process using a half tone mask or a slit mask.

In one embodiment, the first cover layer 320 may be formed at a height lower than that of the first planarization film 160, the second planarization film 170, the bank 180 or the spacer 181 through the exposure process using a half tone mask. Therefore, the first cover layer 320 may be formed without a separate manufacturing process and at the same time minimize occurrence of the step difference in the organic film open area O.

In other embodiment, the first cover layer 320 may be formed to have an inclined side smaller than 90° through the exposure process using a half tone mask or a slit mask. In more detail, a full tone mask may be arranged in an area where an upper surface of the first cover layer 320 is to be formed, and a half tone mask or a slit mask may be arranged in an area where an inclined side of the first cover layer 320 is to be formed, whereby the exposure process may be performed to form the first cover layer 320 having an inclined side smaller than 90°. As a result, the first inorganic film 191 may be formed at a uniform thickness in the area where the first cover layer 320 adjoins the passivation film 150.

Also, since the first cover layer 320 is formed of the organic material as described above, a water permeation path may be provided. To avoid this, the first cover layer 320 may be spaced apart from the organic films formed in the display area AA, for example, the first planarization film 160, the second planarization film 170, the bank 180 and the spacer 181. Alternatively, the first cover layer 320 may be spaced apart from the dam 290. Also, the first cover layer 320 may be formed in such a manner that a plurality of line patterns are spaced apart from each other.

In the present disclosure, the first cover layer 320 is formed on the compensation transistor 310 in the organic film open area O to overlap the seventh contact hole CT7. Therefore, in the present disclosure, the passivation film 150 in the organic film open area O may be prevented from being damaged during the manufacturing process.

Also, in the present disclosure, connection between the compensation transistor 310 and the cathode electrode 270 may be blocked in the organic film open area O.

Also, in the present disclosure, the first cover layer 320 may be arranged to be spaced apart from the organic films formed in the display area AA, for example, the first planarization film 160, the second planarization film 170, the bank 180 and the spacer 181, or the dam 290, whereby water may be prevented from being permeated into the light emitting diode.

Also, in the present disclosure, a flow speed of the organic film 192 constituting the encapsulation film 190 may be reduced by the first cover layer 320 formed to be adjacent to the dam 290. Therefore, the organic film 192 may effectively be blocked from overflowing to the outside of the dam 290.

Also, in the present disclosure, the first cover layer 320 may be formed to have an inclined side smaller than 90°, whereby the first inorganic film 191 constituting the encapsulation film 190 may be formed at the uniform thickness.

Also, in the present disclosure, the first cover layer 320 may be formed of the same material as that of at least one of the first planarization film 160, the second planarization film 170, the bank 180 and the spacer 181 simultaneously with at least one of the first planarization film 160, the second planarization film 170, the bank 180 and the spacer 181, whereby the first cover layer 320 may be formed without a separate manufacturing process.

Also, in the present disclosure, the compensation transistor 310 or the compensation capacitor may be formed in the non-display area NA, whereby load deviation generated in the gate lines may be compensated, wherein each gate line has the number of pixels P different from the number of pixels P of another gate line.

Second Embodiment

Figure 7:
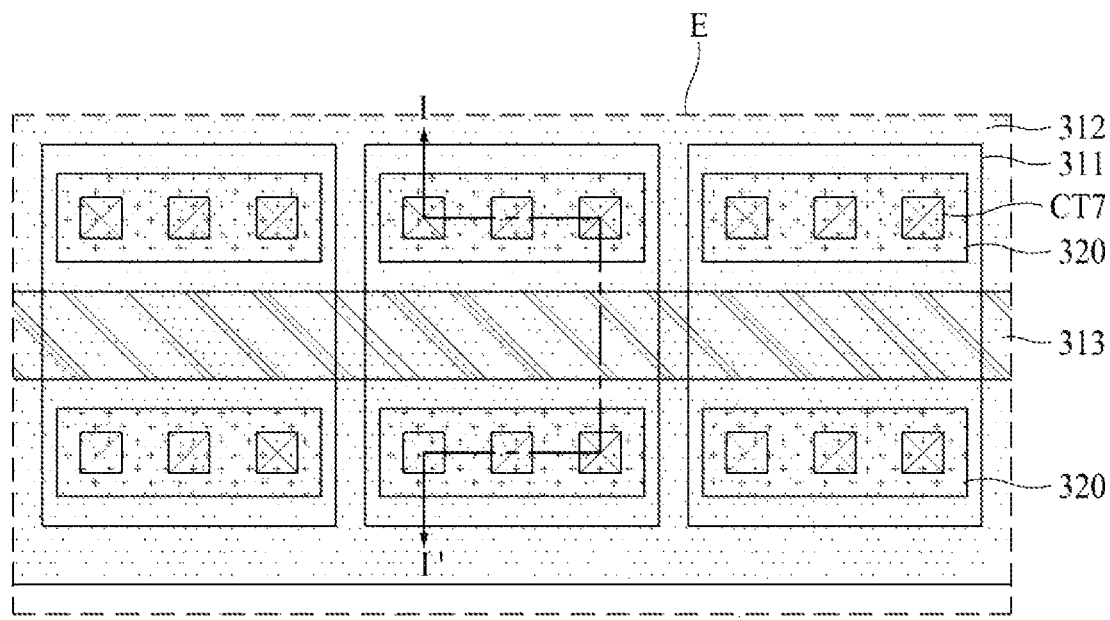
FIG. 7 is a detailed plane view illustrating a second embodiment of a non-display area of FIG. 2.

FIG. 7 is a detailed plane view illustrating a second embodiment of a non-display area of FIG. 2.

The non-display area NA shown in FIG. 7 is different from the non-display area NA shown in FIGS. 4 to 6 in that the first cover layer 320 has a rectangular form not a line form. Since the compensation transistor 310 and the dam 290 shown in FIG. 7 are the same as those shown in FIGS. 4 to 6, their description will be omitted.

The first cover layer 320 is arranged on the compensation transistor 310 of the non-display area NA. The first cover layer 320 serves to cover a step difference generated by the seventh contact hole CT7 of the compensation transistor 310.

The first cover layer 320 is arranged to overlap the seventh contact hole CT7 of the compensation transistor 310, whereby a groove generated by the seventh contact hole CT7 is filled with the first cover layer 320. If a plurality of seventh contact holes CT7 are provided, the first cover layer 320 may be patterned in a rectangular form to overlap at least one of the plurality of seventh contact holes CT7.

The first cover layer 320 shown in FIG. 4 is patterned in the form of a line, whereas the first cover layer 320 shown in FIG. 7 is a form that an organic material of some area where the seventh contact hole CT7 is not formed is removed from the pattern in the form of a line. In the present disclosure, a flow speed of the organic film 192 constituting the encapsulation film 190 may be reduced by the first cover layer 320, and the organic film 192 may be prevented from overflowing to the outside of the dam 290. However, as shown in FIG. 4, if the first cover layer 320 is formed in the line pattern, the first cover layer 320 may prevent the organic film 192 constituting the encapsulation film 190 from flowing from the display area AA to the dam 290. Although a problem may occur in that the organic film 192 constituting the encapsulation film 190 overflows to the outside of the dam 290 as described above, a problem may occur in that the dam 290 may not be fully filled with the organic film 192.

In order that the organic film 192 constituting the encapsulation film 190 flows to the dam 290, in the present disclosure according to the second embodiment, the first cover layer 320 is formed to have a plurality of rectangular patterns as shown in FIG. 7. Therefore, in the present disclosure according to the second embodiment, a flow path from the display area AA to the dam 290 may be provided.

The first cover layer 320 may be formed simultaneously with at least one of the first planarization film 160, the second planarization film 170, the bank 180 and the spacer 181, and may be made of the same material as that of at least one of the first planarization film 160, the second planarization film 170, the bank 180 and the spacer 181. In this case, the first cover layer 320 may be formed of an organic material such as acrylic resin, epoxy resin, phenolic resin, polyamide resin, and polyimide resin.

Preferably, the first cover layer 320 is formed of the same material as that of the first planarization film 160 simultaneously with the first planarization film 160 to prevent the passivation film 150 in the organic film open area O from being damaged during the later manufacturing process. However, the present disclosure is not limited to this example. The first cover layer 320 may be formed simultaneously with the second planarization film 170, the bank 180 or the spacer 181. In this case, the first cover layer 320 may block that the cathode electrode 270 is connected with the first metal layer 311 of the compensation transistor 310 even though the passivation film 150 is damaged in the organic film open area O.

The first cover layer 320 may be formed to reduce the step difference or have an inclined side through an exposure process using a half tone mask or a slit mask.

In one embodiment, the first cover layer 320 may be formed at a height lower than that of the first planarization film 160, the second planarization film 170, the bank 180 or the spacer 181 through the exposure process using a half tone mask. Therefore, the first cover layer 320 may be formed without a separate manufacturing process and at the same time minimize occurrence of the step difference in the organic film open area O.

In other embodiment, the first cover layer 320 may be formed to have an inclined side smaller than 90° through the exposure process using a half tone mask or a slit mask. In more detail, a full tone mask may be arranged in an area where an upper surface of the first cover layer 320 is to be formed, and a half tone mask or a slit mask may be arranged in an area where an inclined side of the first cover layer 320 is to be formed, whereby the exposure process may be performed to form the first cover layer 320 having an inclined side smaller than 90°. As a result, the first inorganic film 191 may be formed at a uniform thickness in the area where the first cover layer 320 adjoins the passivation film 150.

Meanwhile, since the first cover layer 320 is formed of the organic material as described above, a water permeation path may be provided. To avoid this, the first cover layer 320 may be spaced apart from the organic films formed in the display area AA, for example, the first planarization film 160, the second planarization film 170, the bank 180 and the spacer 181. Alternatively, the first cover layer 320 may be spaced apart from the dam 290. Also, the first cover layer 320 may be formed in such a manner that a plurality of rectangular patterns are spaced apart from each other.

Third Embodiment

Figure 8:
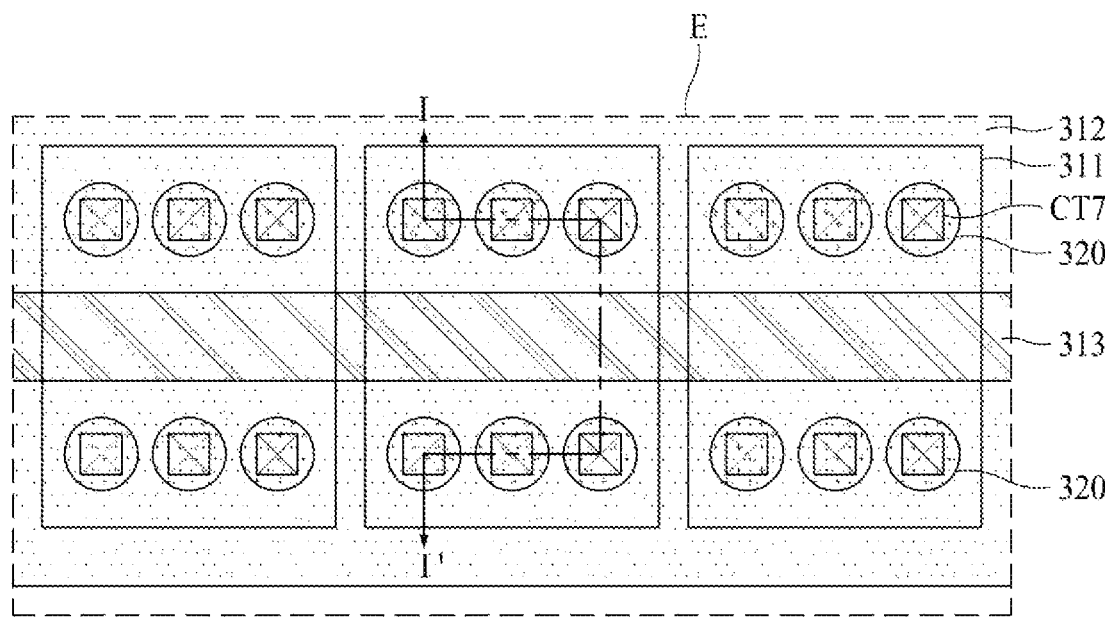
FIG. 8 is a detailed plane view illustrating a third embodiment of a non-display area of FIG. 2.
Figure 9:
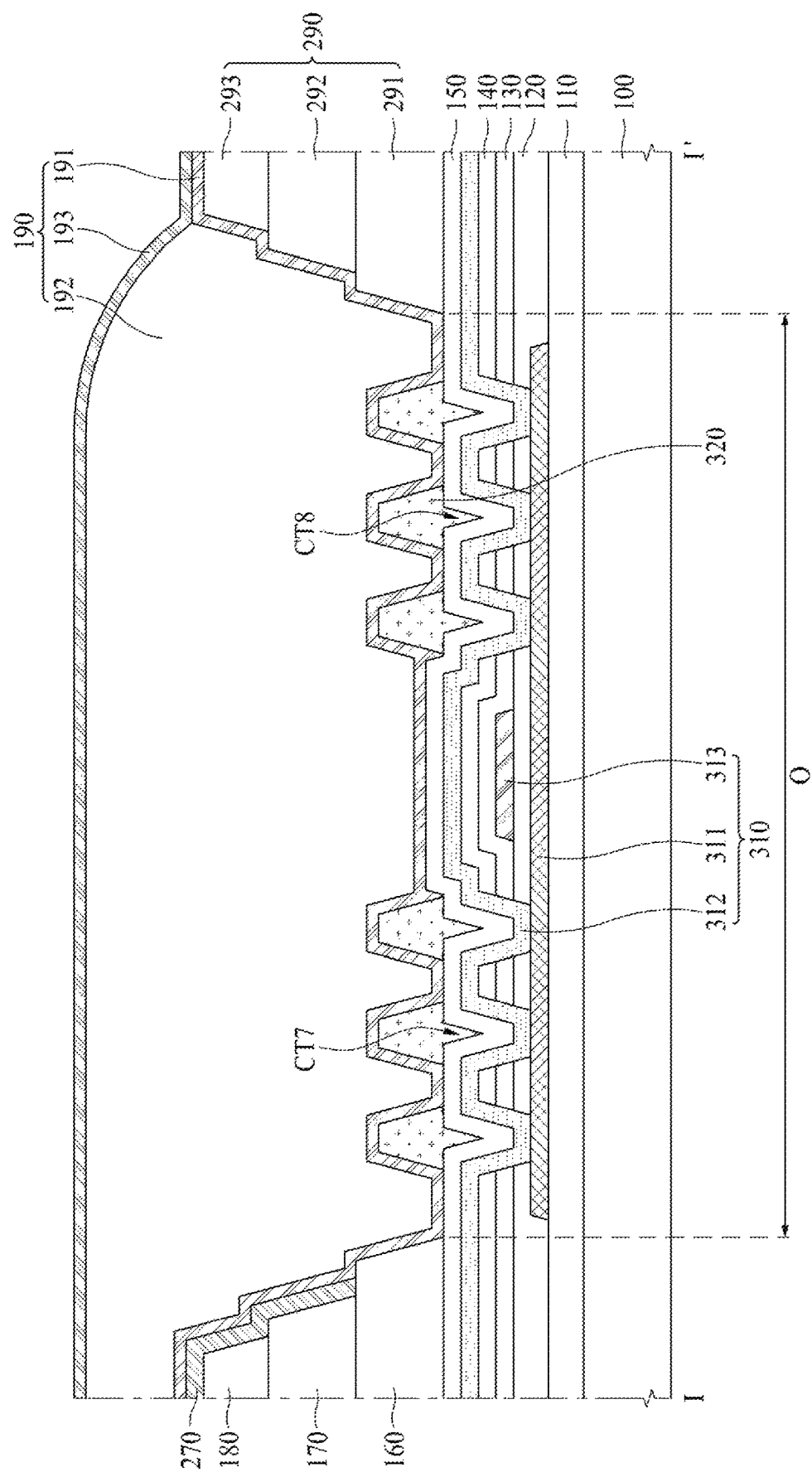
FIG. 9 is a cross-sectional view illustrating an example taken along line I-I' of FIG. 8.

FIG. 8 is a detailed plane view illustrating a third embodiment of a non-display area of FIG. 2, and FIG. 9 is a cross-sectional view illustrating an example taken along line I-I' of FIG. 8.

The non-display area NA shown in FIGS. 8 and 9 is different from the non-display area NA shown in FIGS. 4 to 6 in that the first cover layer 320 has a circular form not a line form. Since the compensation transistor 310 and the dam 290 shown in FIGS. 8 and 9 are the same as those shown in FIGS. 4 to 6, their description will be omitted.

The first cover layer 320 is arranged on the compensation transistor 310 of the non-display area NA. The first cover layer 320 serves to cover a step difference generated by the seventh contact hole CT7 of the compensation transistor 310.

The first cover layer 320 is arranged to overlap the seventh contact hole CT7 of the compensation transistor 310, whereby a groove generated by the seventh contact hole CT7 is filled with the first cover layer 320. If a plurality of seventh contact holes CT7 are provided, the first cover layer 320 may be patterned in a circular form to overlap at least one of the plurality of seventh contact holes CT7.

The first cover layer 320 shown in FIG. 4 is patterned in the form of a line, whereas the first cover layer 320 shown in FIGS. 8 and 9 may be comprised of a plurality of circular patterns respectively corresponding to the plurality of the seventh contact holes CT7. In the present disclosure, a flow speed of the organic film 192 constituting the encapsulation film 190 may be reduced by the first cover layer 320, and the organic film 192 may be prevented from overflowing to the outside of the dam 290. However, as shown in FIG. 4, if the first cover layer 320 is formed in the line pattern, the first cover layer 320 may prevent the organic film 192 constituting the encapsulation film 190 from flowing from the display area AA to the dam 290. Although a problem may occur in that the organic film 192 constituting the encapsulation film 190 overflows to the outside of the dam 290 as described above, a problem may occur in that the dam 290 may not be fully filled with the organic film 192.

In order that the organic film 192 constituting the encapsulation film 190 flows to the dam 290, in the present disclosure according to the third embodiment, the first cover layer 320 is formed to have a plurality of circular patterns as shown in FIGS. 8 and 9. Therefore, in the present disclosure according to the third embodiment, a flow path from the display area AA to the dam 290 may be provided.

The first cover layer 320 may be formed simultaneously with at least one of the first planarization film 160, the second planarization film 170, the bank 180 and the spacer 181, and may be made of the same material as that of at least one of the first planarization film 160, the second planarization film 170, the bank 180 and the spacer 181. In this case, the first cover layer 320 may be formed of an organic material such as acrylic resin, epoxy resin, phenolic resin, polyamide resin, and polyimide resin.

Preferably, the first cover layer 320 is formed of the same material as that of the first planarization film 160 simultaneously with the first planarization film 160 to prevent the passivation film 150 in the organic film open area O from being damaged during the later manufacturing process. However, the present disclosure is not limited to this example. The first cover layer 320 may be formed simultaneously with the second planarization film 170, the bank 180 or the spacer 181. In this case, the first cover layer 320 may block that the cathode electrode 270 is connected with the first metal layer 311 of the compensation transistor 310 even though the passivation film 150 is damaged in the organic film open area O.

The first cover layer 320 may be formed to reduce the step difference or have an inclined side through an exposure process using a half tone mask or a slit mask.

In one embodiment, the first cover layer 320 may be formed at a height lower than that of the first planarization film 160, the second planarization film 170, the bank 180 or the spacer 181 through the exposure process using a half tone mask. Therefore, the first cover layer 320 may be formed without a separate manufacturing process and at the same time minimize occurrence of the step difference in the organic film open area O.

In other embodiment, the first cover layer 320 may be formed to have an inclined side smaller than 90° through the exposure process using a half tone mask or a slit mask. In more detail, a full tone mask may be arranged in an area where an upper surface of the first cover layer 320 is to be formed, and a half tone mask or a slit mask may be arranged in an area where an inclined side of the first cover layer 320 is to be formed, whereby the exposure process may be performed to form the first cover layer 320 having an inclined side smaller than 90°. As a result, the first inorganic film 191 may be formed at a uniform thickness in the area where the first cover layer 320 adjoins the passivation film 150.

Meanwhile, since the first cover layer 320 is formed of the organic material as described above, a water permeation path may be provided. To avoid this, the first cover layer 320 may be spaced apart from the organic films formed in the display area AA, for example, the first planarization film 160, the second planarization film 170, the bank 180 and the spacer 181. Alternatively, the first cover layer 320 may be spaced apart from the dam 290. Also, the first cover layer 320 may be formed in such a manner that a plurality of circular patterns are spaced apart from each other.

Fourth Embodiment

Figure 10:
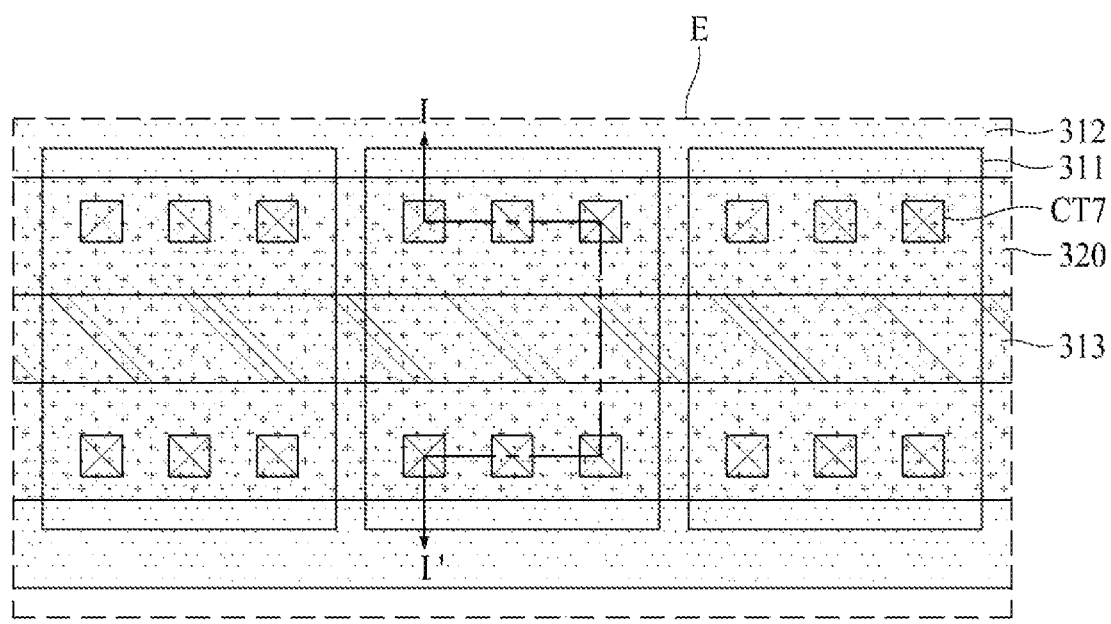
FIG. 10 is a detailed plane view illustrating a fourth embodiment of a non-display area of FIG. 2.
Figure 11:
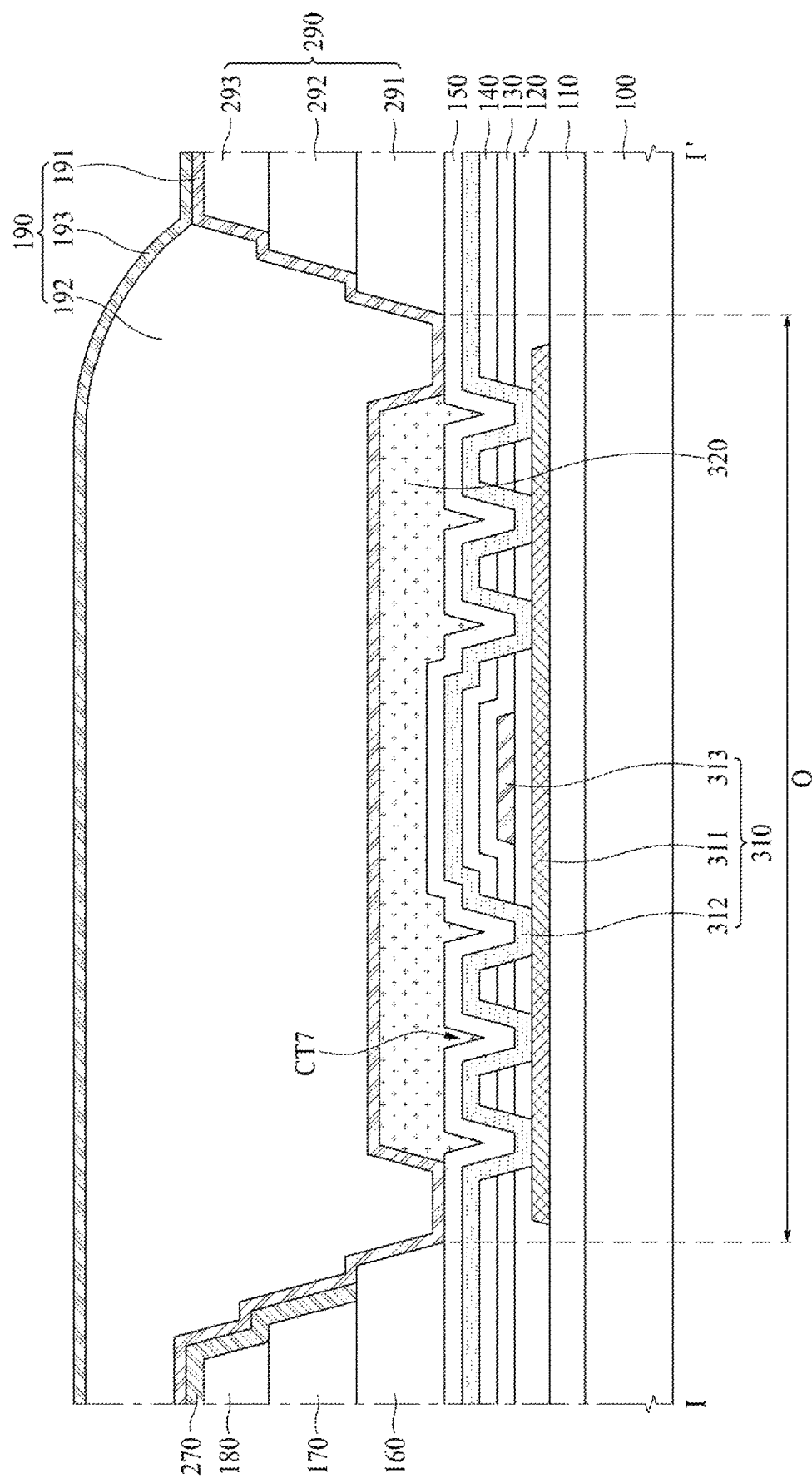
FIG. 11 is a cross-sectional view illustrating an example taken along line I-I' of FIG. 10.

FIG. 10 is a detailed plane view illustrating a fourth embodiment of a non-display area of FIG. 2, and FIG. 11 is a cross-sectional view illustrating an example taken along line I-I' of FIG. 10.

The non-display area NA shown in FIGS. 10 and 11 is different from the non-display area NA shown in FIGS. 4 to 6 in that the first cover layer 320 is formed to overlap the third metal layer 313 as well as the seventh contact hole CT7. Since the compensation transistor 310 and the dam 290 shown in FIGS. 10 and 11 are the same as those shown in FIGS. 4 to 6, their description will be omitted.

The first cover layer 320 is arranged on the compensation transistor 310 of the non-display area NA. The first cover layer 320 serves to cover a step difference generated by the seventh contact hole CT7 of the compensation transistor 310.

The first cover layer 320 is arranged to overlap the seventh contact hole CT7 of the compensation transistor 310 and the third metal layer 313, whereby a groove generated by the seventh contact hole CT7 is filled with the first cover layer 320. If a plurality of seventh contact holes CT7 are provided, the first cover layer 320 may be formed in one pattern to overlap all of the plurality of seventh contact holes CT7.

The first cover layer 320 shown in FIG. 4 is patterned in the form of a plurality of lines, whereas the first cover layer 320 shown in FIGS. 10 and 11 may be formed in one pattern to overlap all of the plurality of the seventh contact holes CT7. The first cover layer 320 may generate a new step difference in the organic film open area O. If the first cover layer 320 is formed in a pattern of a plurality of lines as shown in FIG. 4, the first cover layer 320 may generate more step differences, whereby an uneven surface may be formed.

The first inorganic film 191 constituting the encapsulation film 190 is formed on the uneven surface formed by the first cover layer 320 during the process of forming the encapsulation film 190, whereby the thickness of the first inorganic film 191 is not formed uniformly. Particularly, the first inorganic film 191 may be formed more thinly in an area between one line pattern and another line pattern, whereby a crack may be generated. The crack may be propagated into the inside along the inorganic film by external impart, and water or oxygen entering the inside along the propagated crack may cause a dark spot and a dark line spot. To solve this problem, in the fourth embodiment of the present disclosure, the first cover layer 320 may be formed in one pattern to overlap all of the plurality of seventh contact holes CT7.

The first cover layer 320 may be formed simultaneously with at least one of the first planarization film 160, the second planarization film 170, the bank 180 and the spacer 181, and may be made of the same material as that of at least one of the first planarization film 160, the second planarization film 170, the bank 180 and the spacer 181. In this case, the first cover layer 320 may be formed of an organic material such as acrylic resin, epoxy resin, phenolic resin, polyamide resin, and polyimide resin.

Preferably, the first cover layer 320 is formed of the same material as that of the first planarization film 160 simultaneously with the first planarization film 160 to prevent the passivation film 150 in the organic film open area O from being damaged during the later manufacturing process. However, the present disclosure is not limited to this example. The first cover layer 320 may be formed simultaneously with the second planarization film 170, the bank 180 or the spacer 181. In this case, the first cover layer 320 may block that the cathode electrode 270 is connected with the first metal layer 311 of the compensation transistor 310 even though the passivation film 150 is damaged in the organic film open area O.

The first cover layer 320 may be formed to reduce the step difference or have an inclined side through an exposure process using a half tone mask or a slit mask.

In one embodiment, the first cover layer 320 may be formed at a height lower than that of the first planarization film 160, the second planarization film 170, the bank 180 or the spacer 181 through the exposure process using a half tone mask. Therefore, the first cover layer 320 may be formed without a separate manufacturing process and at the same time minimize occurrence of the step difference in the organic film open area O.

In other embodiment, the first cover layer 320 may be formed to have an inclined side smaller than 90° through the exposure process using a half tone mask or a slit mask. In more detail, a full tone mask may be arranged in an area where an upper surface of the first cover layer 320 is to be formed, and a half tone mask or a slit mask may be arranged in an area where an inclined side of the first cover layer 320 is to be formed, whereby the exposure process may be performed to form the first cover layer 320 having an inclined side smaller than 90°. As a result, the first inorganic film 191 may be formed at a uniform thickness in the area where the first cover layer 320 adjoins the passivation film 150.

Meanwhile, since the first cover layer 320 is formed of the organic material as described above, a water permeation path may be provided. To avoid this, the first cover layer 320 may be spaced apart from the organic films formed in the display area AA, for example, the first planarization film 160, the second planarization film 170, the bank 180 and the spacer 181. Alternatively, the first cover layer 320 may be spaced apart from the dam 290.

Fifth Embodiment

Figure 12:
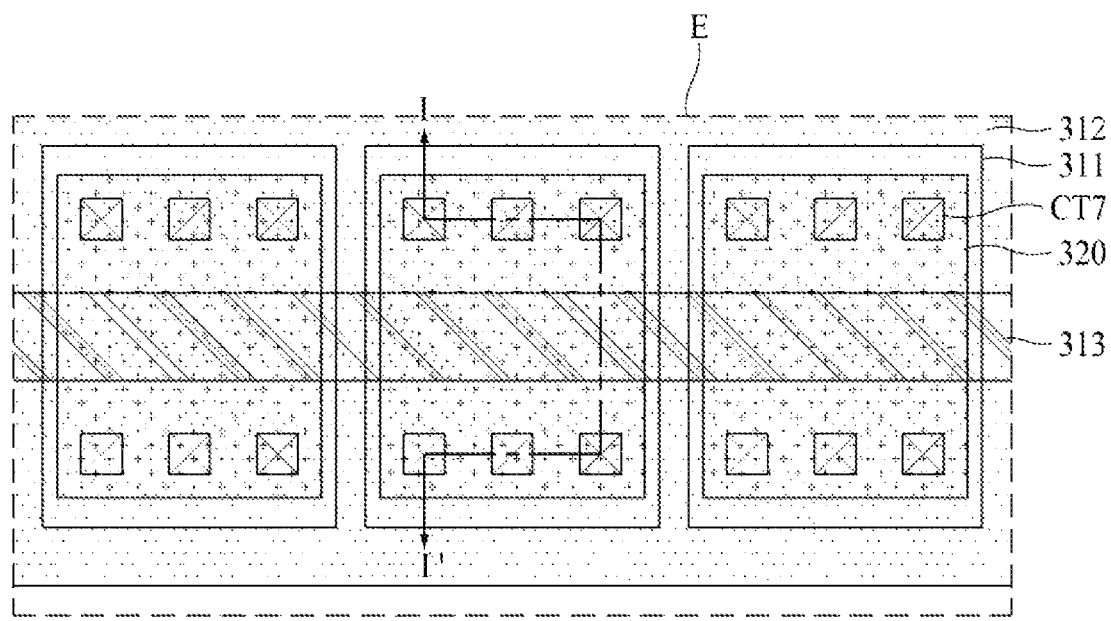
FIG. 12 is a detailed plane view illustrating a fifth embodiment of a non-display area of FIG. 2.

FIG. 12 is a detailed plane view illustrating a fifth embodiment of a non-display area of FIG. 2.

The non-display area NA shown in FIG. 12 is different from the non-display area NA shown in FIG. 10 in that the first cover layer 320 has a plurality of rectangular patterns. Hereinafter, the non-display area will be described based on the difference from FIG. 10.

The first cover layer 320 is arranged on the compensation transistor 310 of the non-display area NA. The first cover layer 320 serves to cover a step difference generated by the seventh contact hole CT7 of the compensation transistor 310.

The first cover layer 320 is arranged to overlap the seventh contact hole CT7 of the compensation transistor 310 and the third metal layer 313, whereby a groove generated by the seventh contact hole CT7 is filled with the first cover layer 320. If a plurality of seventh contact holes CT7 are provided, the first cover layer 320 may be formed in a plurality of rectangular patterns overlapped with at least one of the plurality of seventh contact holes CT7 as shown in FIG. 10.

The first cover layer 320 is arranged on the compensation transistor 310 of the non-display area NA. The first cover layer 320 serves to cover the step difference generated by the seventh contact holes CT7 of the compensation transistor 310.

The first cover layer 320 is arranged to overlap the seventh contact hole CT7 of the compensation transistor 310 and the third metal layer 313, whereby the groove generated by the seventh contact holes CT7 is filled with the first cover layer 320. If the plurality of seventh contact holes CT7 are provided, the first cover layer 320 may be patterned in a rectangular form to overlap at least one of the plurality of seventh contact holes CT7 as shown in FIG. 7.

The first cover layer 320 shown in FIG. 10 is patterned in one line pattern, whereas the first cover layer 320 shown in FIG. 12 may be formed in a plurality of rectangular patterns from which an organic material of some area where the seventh contact hole CT7 is not formed is removed in one line pattern. In the present disclosure, a flow speed of the organic film 192 constituting the encapsulation film 190 may be reduced by the first cover layer 320, and the organic film 192 may be prevented from overflowing to the outside of the dam 290. However, as shown in FIG. 10, if the first cover layer 320 is formed in one line pattern, the first cover layer 320 may prevent the organic film 192 constituting the encapsulation film 190 from flowing from the display area AA to the dam 290. Although a problem may occur in that the organic film 192 constituting the encapsulation film 190 overflows to the outside of the dam 290 as described above, a problem may occur in that the dam 290 may not be sufficiently filled with the organic film 192.

In order that the organic film 192 constituting the encapsulation film 190 flows to the dam 290, in the present disclosure according to the fifth embodiment, the first cover layer 320 is formed in a plurality of rectangular patterns as shown in FIG. 12. Therefore, in the present disclosure according to the fifth embodiment, a flow path from the display area AA to the dam 290 may be provided.

The first cover layer 320 may be formed simultaneously with at least one of the first planarization film 160, the second planarization film 170, the bank 180 and the spacer 181, and may be made of the same material as that of at least one of the first planarization film 160, the second planarization film 170, the bank 180 and the spacer 181. In this case, the first cover layer 320 may be formed of an organic material such as acrylic resin, epoxy resin, phenolic resin, polyamide resin, and polyimide resin.

Preferably, the first cover layer 320 is formed of the same material as that of the first planarization film 160 simultaneously with the first planarization film 160 to prevent the passivation film 150 in the organic film open area O from being damaged during the later manufacturing process. However, the present disclosure is not limited to this example. The first cover layer 320 may be formed simultaneously with the second planarization film 170, the bank 180 or the spacer 181. In this case, the first cover layer 320 may block that the cathode electrode 270 is connected with the first metal layer 311 of the compensation transistor 310 even though the passivation film 150 is damaged in the organic film open area O.

The first cover layer 320 may be formed to reduce the step difference or have an inclined side through an exposure process using a half tone mask or a slit mask.

In one embodiment, the first cover layer 320 may be formed at a height lower than that of the first planarization film 160, the second planarization film 170, the bank 180 or the spacer 181 through the exposure process using a half tone mask. Therefore, the first cover layer 320 may be formed without a separate manufacturing process and at the same time minimize occurrence of the step difference in the organic film open area O.

In other embodiment, the first cover layer 320 may be formed to have an inclined side smaller than 90° through the exposure process using a half tone mask or a slit mask. In more detail, a full tone mask may be arranged in an area where an upper surface of the first cover layer 320 is to be formed, and a half tone mask or a slit mask may be arranged in an area where an inclined side of the first cover layer 320 is to be formed, whereby the exposure process may be performed to form the first cover layer 320 having an inclined side smaller than 90°. As a result, the first inorganic film 191 may be formed at a uniform thickness in the area where the first cover layer 320 adjoins the passivation film 150.

Meanwhile, since the first cover layer 320 is formed of the organic material as described above, a water permeation path may be provided. To avoid this, the first cover layer 320 may be spaced apart from the organic films formed in the display area AA, for example, the first planarization film 160, the second planarization film 170, the bank 180 and the spacer 181. Alternatively, the first cover layer 320 may be spaced apart from the dam 290.

Sixth Embodiment, Seventh Embodiment, and Eighth Embodiment

Figure 13:
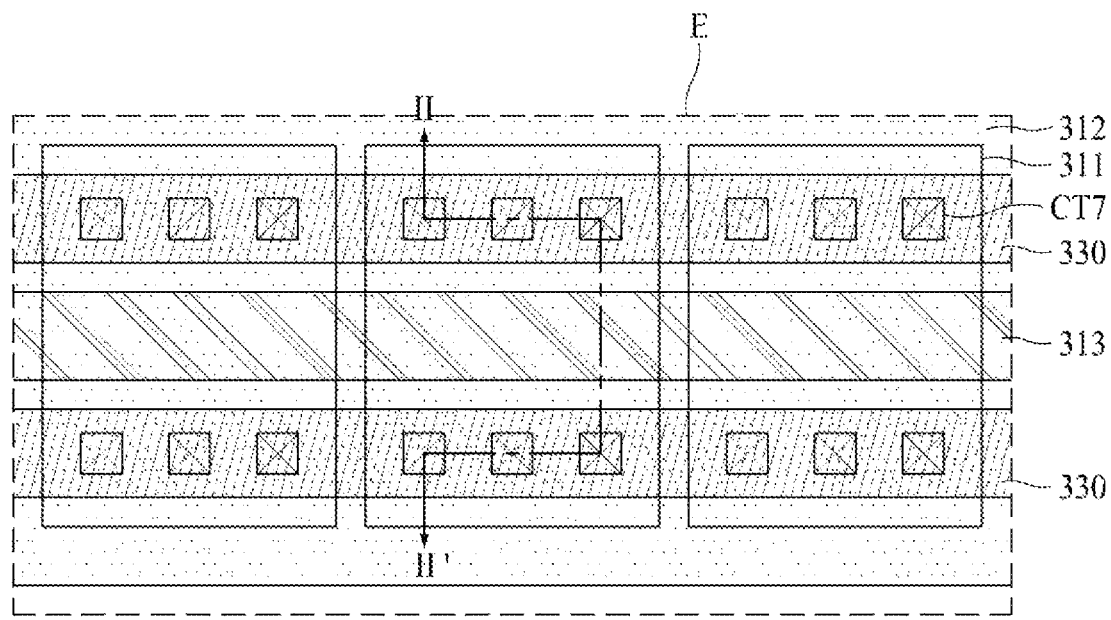
FIG. 13 is a detailed plane view illustrating a sixth embodiment of a non-display area of FIG. 2.
Figure 14:
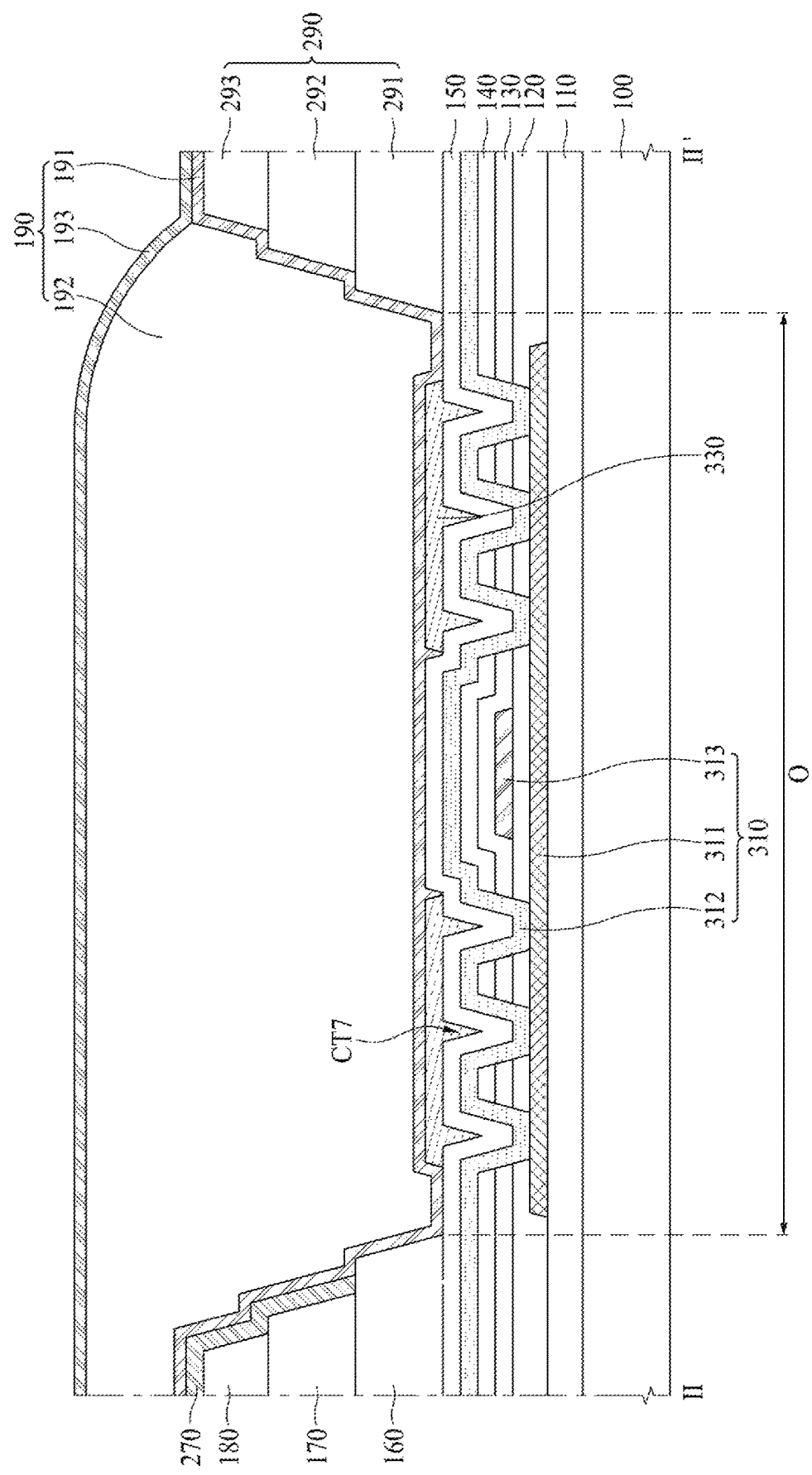
FIG. 14 is a cross-sectional view illustrating an example taken along line II-II' of FIG. 13.
Figure 15:
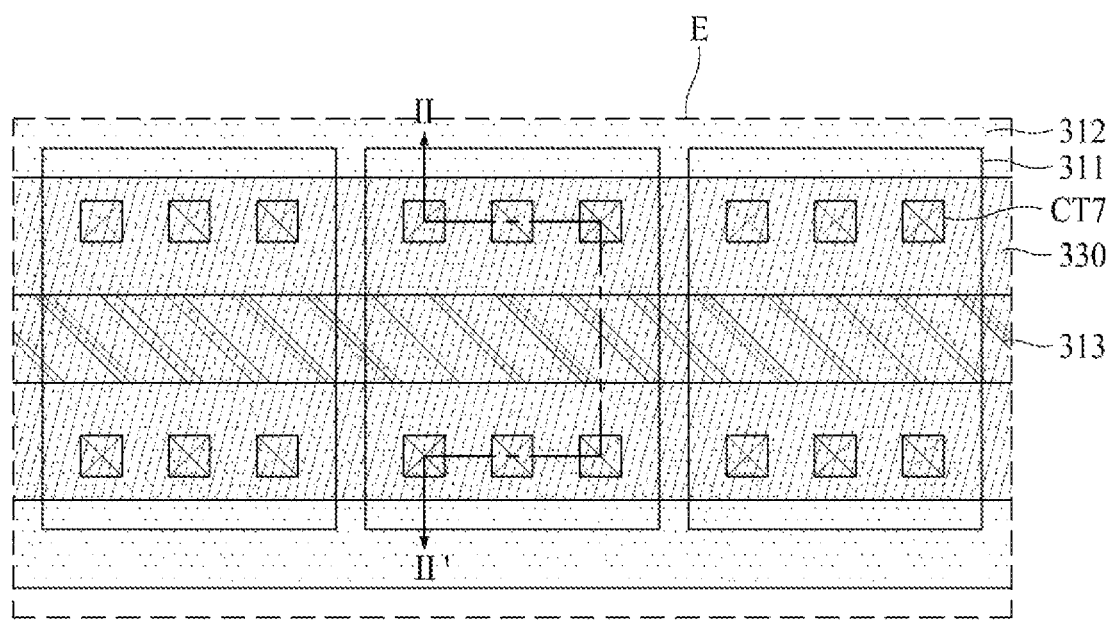
FIG. 15 is a detailed plane view illustrating a seventh embodiment of a non-display area of FIG. 2.
Figure 16:
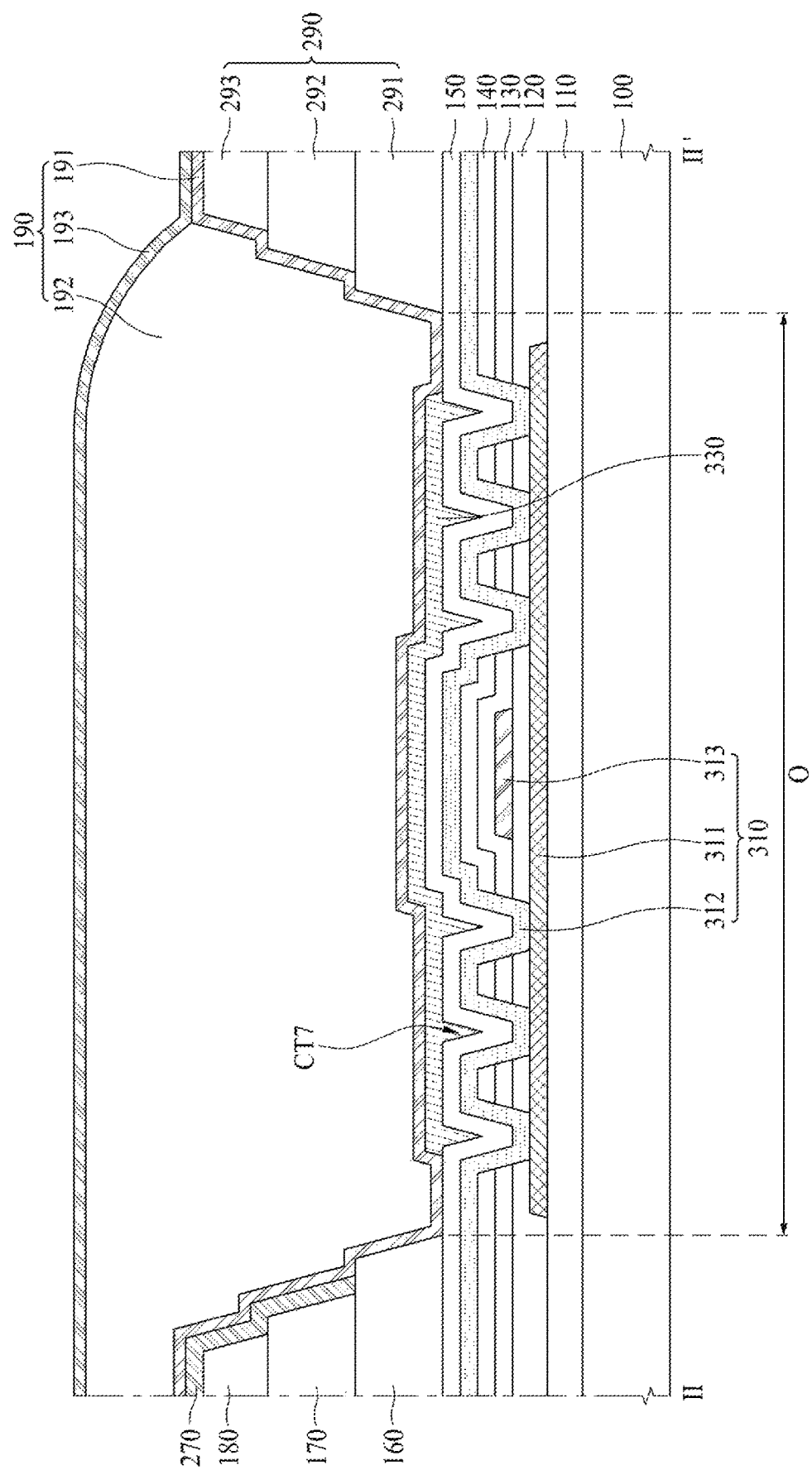
FIG. 16 is a cross-sectional view illustrating an example taken along line II-II' of FIG. 15.
Figure 17:
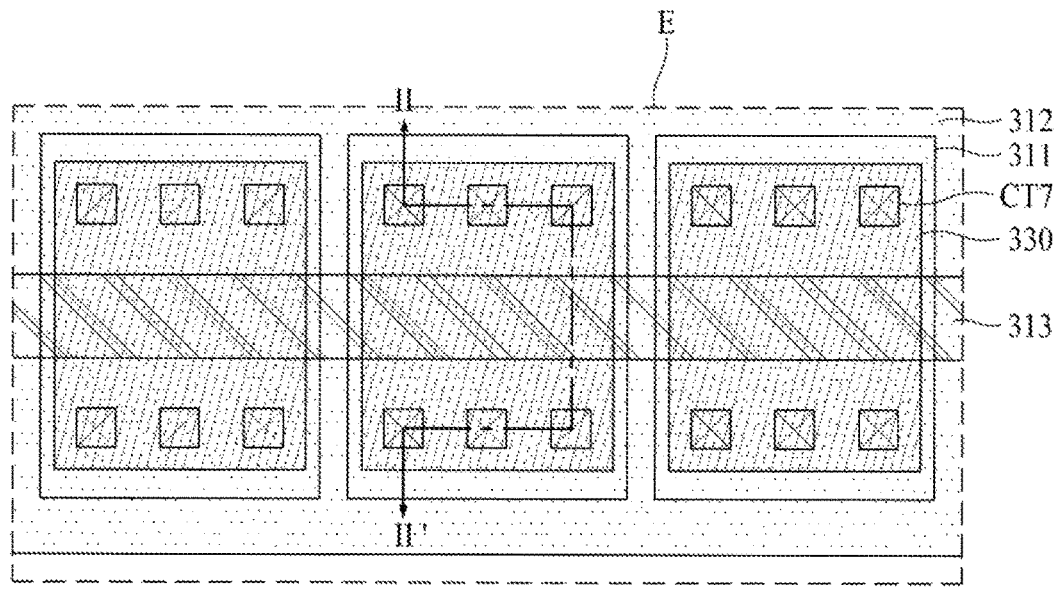
FIG. 17 is a detailed plane view illustrating an eighth embodiment of a non-display area of FIG. 2.

FIG. 13 is a detailed plane view illustrating a sixth embodiment of a non-display area of FIG. 2, FIG. 14 is a cross-sectional view illustrating an example taken along line II-II' of FIG. 13, FIG. 15 is a detailed plane view illustrating a seventh embodiment of a non-display area of FIG. 2, FIG. 16 is a cross-sectional view illustrating an example taken along line II-II' of FIG. 15, and FIG. 17 is a detailed plane view illustrating an eighth embodiment of a non-display area of FIG. 2.

The non-display area NA shown in FIGS. 13 to 17 is different from the non-display area NA shown in FIGS. 4 to 6 in that the non-display area NA includes a second cover layer 330. Since the compensation transistor 310 and the dam 290 shown in FIGS. 13 to 17 are the same as those shown in FIGS. 4 to 6, their description will be omitted.

The second cover layer 330 is arranged on the compensation transistor 310 of the non-display area NA. The second cover layer 330 serves to cover a step difference generated by the seventh contact hole CT7 of the compensation transistor 310.

The second cover layer 330 is arranged to overlap the seventh contact hole CT7 of the compensation transistor 310, whereby a groove generated by the seventh contact hole CT7 is filled with the second cover layer 330. If a plurality of seventh contact holes CT7 are provided, the second cover layer 330 may be formed in a plurality of line patterns along the plurality of seventh contact holes CT7 as shown in FIG. 13. However, the present disclosure is not limited to this example. In another embodiment, the second cover layer 330 may be formed in one line pattern overlapped with the plurality of seventh contact holes CT7 and the third metal layer 313 as shown in FIG. 15. In other embodiment, the second cover layer 330 may be formed in a plurality of rectangular patterns overlapped with at least two or more of the plurality of seventh contact holes CT7 and the third metal layer 313 as shown in FIG. 17. Meanwhile, although not shown, the second cover layer 330 may be formed in a plurality of rectangular patterns overlapped with at least two or more of the plurality of seventh contact holes CT7. Alternatively, the second cover layer 330 may be formed in a plurality of circular patterns overlapped with at least one of the plurality of seventh contact holes CT7.

The second cover layer 330 may be formed of a metal material. The second cover layer 330 may be formed simultaneously with an anode auxiliary electrode 240 and a second high potential voltage line 232, and may be made of the same material as that of the anode auxiliary electrode 240 and the second high potential voltage line 232. In this case, the second cover layer 330 may be formed of a single layer or multi-layer comprised of any one of Mo, Al, Cr, Au, Ti, Ni, Nd and Cu or their alloy.

The second cover layer 330 may be formed of a metal material but serves to only cover the step difference generated by the seventh contact hole CT7. No voltage is applied to the second cover layer 330.

In the present disclosure according to the sixth embodiment, the second cover layer 330 may be formed of the same material as that of the anode auxiliary electrode 240 and the second high potential voltage line 232 simultaneously with the anode auxiliary electrode 240 and the second high potential voltage line 232, whereby the passivation film 150 formed on the compensation transistor 310 may be prevented from being damaged due to excessive etching during formation of the anode auxiliary electrode 240 and the second high potential voltage line 232.

Also, the second cover layer 330 may generate a new step difference in the organic film open area O. However, in the present disclosure according to the sixth embodiment, the second cover layer 330 may be formed as a thin metal layer to minimize the step difference due to the second cover layer 330, whereby the first inorganic film 191 constituting the encapsulation film 190 may be formed at a uniform thickness.

Also, the second cover layer 330 may be spaced apart from the organic films formed in the display area AA, for example, the first planarization film 160, the second planarization film 170, the bank 180 and the spacer 181. Alternatively, the second cover layer 330 may be spaced apart from the dam 290.

Figure 18:
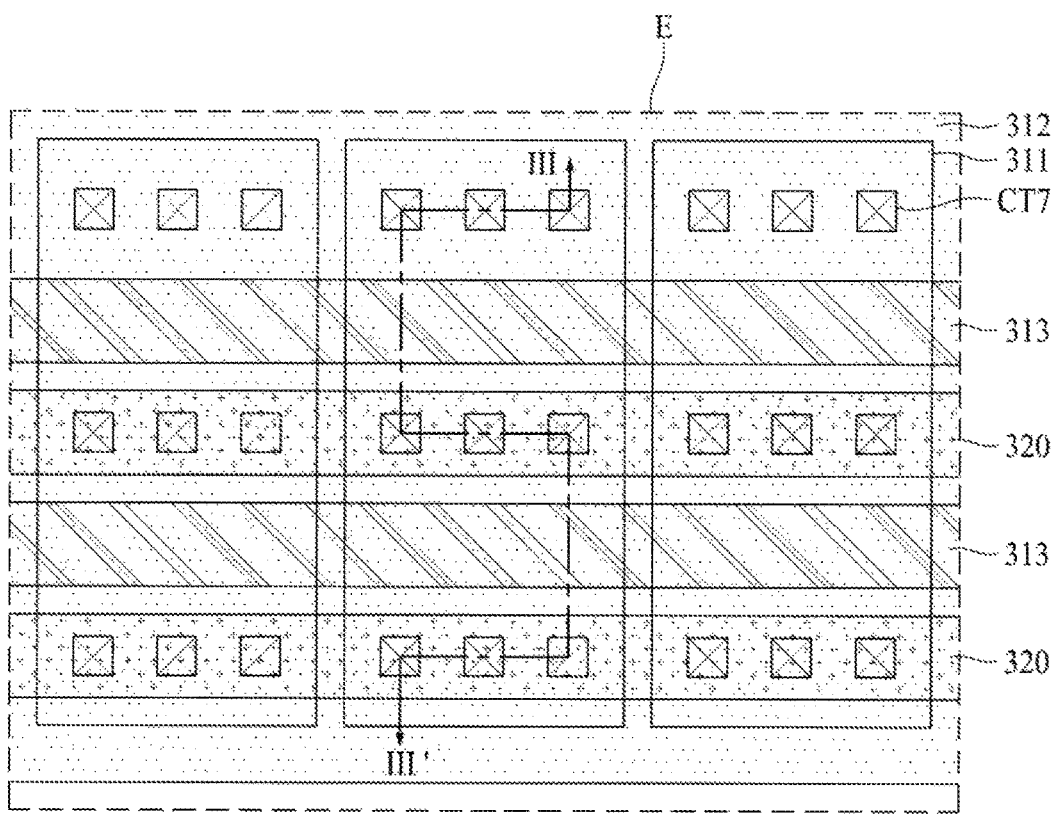
FIG. 18 is a detailed plane view illustrating a modified embodiment of a non-display area of FIG. 2.
Figure 19:
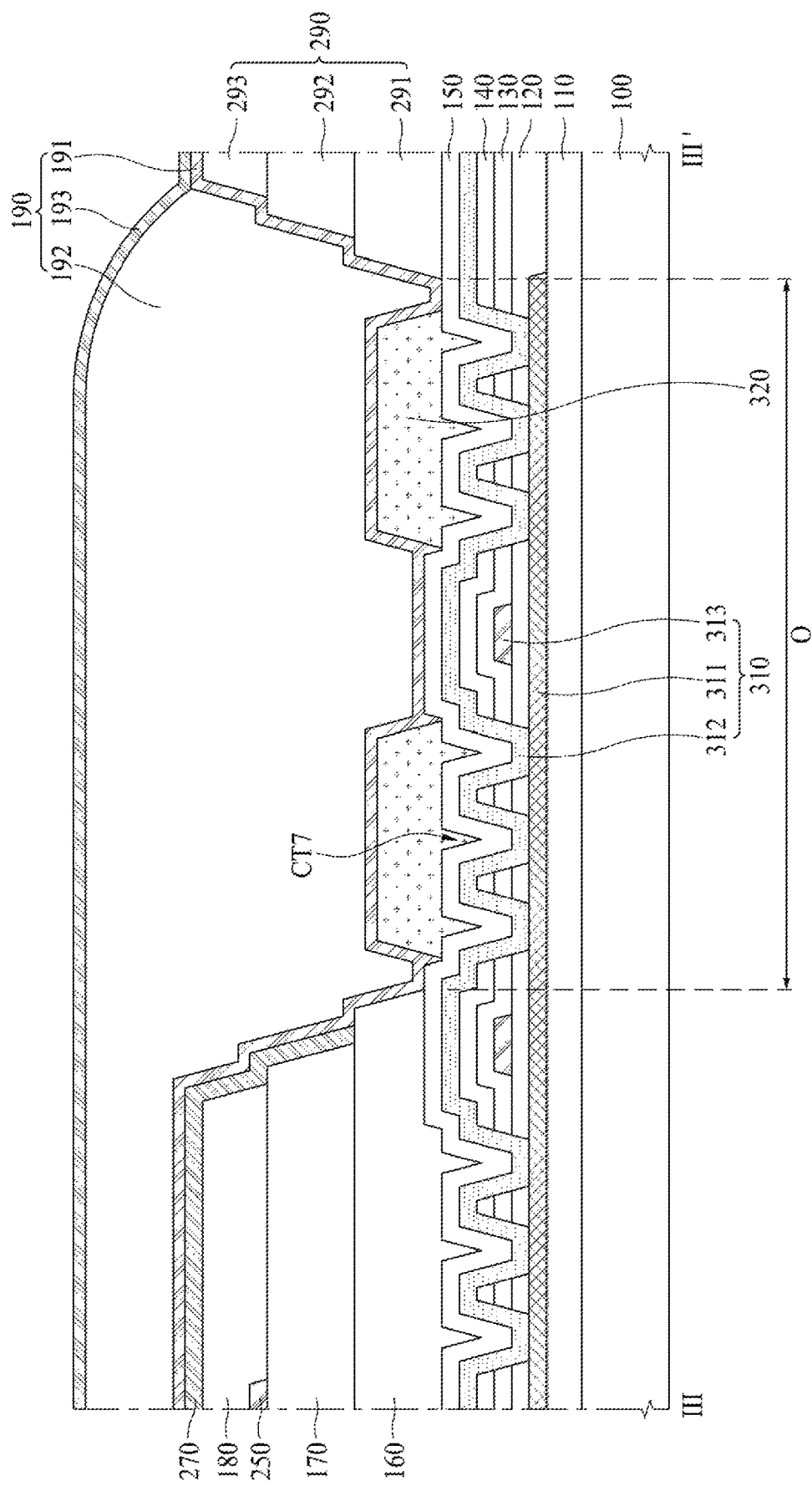
FIG. 19 is a cross-sectional view illustrating an example taken along line III-III' of FIG. 18.

Meanwhile, although the compensation transistor 310 or the compensation capacitor is formed in only the organic film open area O in FIGS. 4 to 17, this is to briefly show the non-display area NA. The present disclosure is not limited to the examples of FIGS. 4 to 17. The compensation transistor 310 or the compensation capacitor may be arranged between the display area AA and the organic film open area O as well as in the organic film open area O as shown in FIGS. 18 and 19. Since at least one of the organic films formed from the display area AA to some of the non-display area NA, for example, the first planarization film 160, the second planarization film 170, the bank 180 and the spacer 181 is formed on the compensation transistor 310 or the compensation capacitor arranged between the display area AA and the organic film open area O, the first cover layer 320 or the second cover layer 330 is not required separately. That is, the first cover layer 320 or the second cover layer 330 of the present disclosure is not formed on the compensation transistor 310 or the compensation capacitor arranged between the display area AA and the organic film open area O, and may be formed on the compensation transistor 310 or the compensation capacitor arranged in the organic film open area O.

Meanwhile, although the compensation transistor 310 or the compensation capacitor is formed on the organic film open area O in the first to eighth embodiments, the present disclosure is not limited to the first to eighth embodiments. The present disclosure may include various embodiments in which the organic film open area O includes a first metal layer, at least one insulating film, and a second metal layer connected to the first metal layer through a contact hole that passes through at least one insulating film. In this case, the first cover layer 320 or the second cover layer 330 may be formed to overlap the contact hole formed in the organic film open area O.

As described above, according to the present disclosure, the following advantages can be obtained.

In the present disclosure, the first cover layer or the second cover layer is formed in the organic film open area to overlap the contact hole, whereby the passivation film arranged in the organic film open area may be prevented from being damaged during the manufacturing process.

Also, in the present disclosure, connection between the metal layer and the cathode electrode formed below the passivation film may be blocked in the organic film open area.

Also, in the present disclosure, the first cover layer may be arranged to be spaced apart from the organic films formed in the display area, for example, the first planarization film, the second planarization film, the bank and the spacer, or the dam formed in the non-display area, whereby water may be prevented from being permeated into the light emitting diode.

Also, in the present disclosure, the first cover layer may be formed of the same material as that of at least one of the first planarization film, the second planarization film, the bank and the spacer simultaneously with at least one of the first planarization film, the second planarization film, the bank and the spacer, whereby the first cover layer may be formed without a separate manufacturing process.

Also, in the present disclosure, the flow speed of the organic film constituting the encapsulation film may be reduced by the first cover layer or the second cover layer formed to be adjacent to the dam. Therefore, the organic film may effectively be blocked from overflowing to the outside of the dam.

Also, in the present disclosure, the first cover layer may be formed to have an inclined side smaller than 90°, whereby the first inorganic film constituting the encapsulation film may be formed at the uniform thickness.

Also, in the present disclosure, the compensation transistor or the compensation capacitor may be formed in the non-display area, whereby load deviation generated in the gate lines may be compensated, wherein each gate line has the number of pixels P different from the number of pixels P of another gate line.

Also, in the present disclosure, the first cover layer is formed in a plurality of rectangular patterns or a plurality of circular patterns, whereby the flow path from the display area to the dam may be provided. Therefore, the organic film constituting the encapsulation film may not overflow to the outside of the dam and at the same time may be filled in the dam sufficiently.

Also, in the present disclosure, the first cover layer is formed in one pattern overlapped with all of the plurality of the contact holes formed in the organic film open area, whereby the area where the step difference is generated may be reduced by the first cover layer.

Also, in the present disclosure, the second cover layer may be formed of a thin metal material, whereby the step difference due to the second cover layer may be minimized.

Also, in the present disclosure, the second cover layer may be formed of the same material as that of the anode auxiliary electrode and the second high potential voltage line simultaneously with the anode auxiliary electrode and the second high potential voltage line, whereby the passivation film formed in organic film open area may be prevented from being damaged due to excessive etching during formation of the anode auxiliary electrode and the second high potential voltage line.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
 a substrate including:
  a display area on which pixels are arranged; and
  a non-display area surrounding the display area;
 a first metal layer formed in the non-display area of the substrate;
 at least one insulating film arranged on the first metal layer;
 a second metal layer arranged on the at least one insulating film and connected with the first metal layer through a contact hole that passes through the at least one insulating film formed in the non-display area;
 at least one organic film arranged in the display area;
 a dam arranged in the non-display area and spaced apart from at least one organic film arranged in the display area;
 a cover layer arranged on the contact hole and formed to overlap the contact hole; and
 an encapsulation film formed to cover the display area and the cover layer,
 wherein the cover layer is arranged between the at least one organic film and the dam, and is made of an organic material a same material as that of any one of the at least one organic film.

2. The display device of claim 1, wherein each of the pixels includes:
 a thin film transistor including an active layer, a gate electrode, a source electrode and a drain electrode;
 the first metal layer is made of the same material as that of the active layer of the thin film transistor on the same layer as the active layer of the thin film transistor; and
 the second metal layer is made of the same material as that of the source electrode and the drain electrode of the thin film transistor on the same layer as the source electrode and the drain electrode of the thin film transistor.

3. The display device of claim 1, wherein the cover layer is not in contact with the at least one organic film.

4. The display device of claim 1, wherein the cover layer is not in contact with the dam.

5. The display device of claim 1, wherein:
 the second metal layer is connected with the first metal layer through a plurality of contact holes;
 the cover layer is formed of a plurality of patterns; and
 one of the plurality of patterns covers at least one of the plurality of contact holes.

6. The display device of claim 5, wherein the cover layer is arranged in such a manner that the respective patterns are spaced apart from each other.

7. The display device of claim 1, wherein the encapsulation film includes:
 a first inorganic film formed to cover the display area and the cover layer;
 an organic film formed on the first inorganic film; and
 a second inorganic film formed to cover the organic film and the dam.

8. A display device, comprising:
 a substrate including:
  a display area on which pixels area arranged; and
  a non-display area surrounding the display area;
 a first metal layer formed in the non-display area of the substrate;
 at least one insulating film arranged on the first metal layer;
 a second metal layer arranged on the at least one insulating film, the second metal layer being connected with the first metal layer through a contact hole that passes through the at least one insulating film formed in the non-display area;
 a passivation film arranged on the second metal layer;
 at least one organic film arranged in the display area;
 a dam arranged in the non-display area and spaced apart from at least one organic film arranged in the display area;
 a cover layer arranged on the contact hole and formed to overlap the contact hole; and
 an encapsulation film formed to cover the display area and the cover layer,
 wherein the cover layer is made of a metal material, and
 wherein the cover layer is arranged between the at least one organic film and the dam.

9. The display device of claim 8, wherein:
 each of the pixels includes:
  a thin film transistor including:
   an active layer;
   a gate electrode;
   a source electrode; and
   a drain electrode;
  an anode auxiliary electrode connected to the source electrode or the drain electrode of the thin film transistor; and
  an anode electrode connected to the anode auxiliary electrode; and
 the cover layer is made of the same material as that of the anode auxiliary electrode.

10. The display device of claim 8, wherein no voltage is applied to the cover layer.

11. A display device, comprising:
 a substrate including:
  a display area on which pixels are arranged; and
  a non-display area surrounding the display area;
 a first gate line connected with N pixels of the pixels;
 a second gate line connected with M pixels smaller than the N pixels; and
 a compensation transistor or a compensation capacitor arranged in the non-display area, and connected with the second gate line,
 wherein the compensation transistor or the compensation capacitor includes:
  a first metal layer formed on the substrate,
  a first insulating film arranged on the first metal layer,
  a third metal layer arranged on the first insulating film and connected with the second gate line,
  a second insulating film arranged on the third metal layer,
  a second metal layer arranged on the second insulating film and connected with the first metal layer through a contact hole that passes through at least one of the first and second insulating films, and
  a cover layer arranged on the contact hole.

12. The display device of claim 11, wherein each of the pixels includes:
 a thin film transistor including an active layer, a gate electrode, a source electrode and a drain electrode;
 the first metal layer is formed on the same layer as the active layer of the thin film transistor; and
 the second metal layer is made of the same material as that of the source electrode and the drain electrode of the thin film transistor on the same layer as the source electrode and the drain electrode of the thin film transistor.

13. The display device of claim 12, wherein the first metal layer of the compensation transistor is made of the same semiconductor material as that of the active layer.

14. The display device of claim 12, wherein the first metal layer of the compensation capacitor is made of a metal material.

15. The display device of claim 11, further comprising:
at least one organic film arranged in the display area; and
a dam arranged in the non-display area, the dam being spaced apart from at least one organic film arranged in the display area,
wherein the cover layer is arranged between the at least one organic film and the dam.

16. The display device of claim 15, wherein the cover layer is made of an organic material.

17. The display device of claim 16, wherein:
the second metal layer is connected with the first metal layer through a plurality of contact holes;
the cover layer is formed of a plurality of patterns; and
one of the plurality of patterns having a shape covering at least one of the plurality of contact holes.

18. The display device of claim 17, wherein the cover layer is arranged in such a manner that the respective patterns are spaced apart from each other.

19. The display device of claim 15, further comprising:
a passivation film arranged on the second metal layer,
wherein the cover layer is made of a metal material.

20. The display device of claim 19, wherein:
each of the pixels includes:
a thin film transistor including an active layer, a gate electrode, a source electrode and a drain electrode;
an anode auxiliary electrode connected to the source electrode or the drain electrode of the thin film transistor; and
an anode electrode connected to the anode auxiliary electrode; and
the cover layer is made of the same material as that of the anode auxiliary electrode.

* * * * *